United States Patent
Broell et al.

(10) Patent No.: US 11,677,042 B2
(45) Date of Patent: *Jun. 13, 2023

(54) REGROWTH OF EPITAXIAL LAYER FOR SURFACE RECOMBINATION VELOCITY REDUCTION IN LIGHT EMITTING DIODES

(71) Applicant: Meta Platforms Technologies, LLC, Menlo Park, CA (US)

(72) Inventors: Markus Broell, Cork (IE); Michael Grundmann, Kirkland, WA (US); David Hwang, Cork (IE); Stephan Lutgen, Dresden (DE); Brian Matthew Mcskimming, Mill Creek, WA (US); Anurag Tyagi, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 290 days.

This patent is subject to a terminal disclaimer.

(21) Appl. No.: 16/833,614

(22) Filed: Mar. 29, 2020

(65) Prior Publication Data

US 2020/0313036 A1  Oct. 1, 2020

Related U.S. Application Data

(60) Provisional application No. 62/826,683, filed on Mar. 29, 2019.

(51) Int. Cl.
*H01L 33/32* (2010.01)
*H01L 33/00* (2010.01)
*H01L 27/15* (2006.01)

(52) U.S. Cl.
CPC ........ *H01L 33/0095* (2013.01); *H01L 27/156* (2013.01); *H01L 33/0075* (2013.01); *H01L 33/32* (2013.01)

(58) Field of Classification Search
None
See application file for complete search history.

(56) References Cited

U.S. PATENT DOCUMENTS 4,468,850 A * 9/1984 Liau .................... H01L 33/0025
438/909
10,811,460 B2 * 10/2020 Dimitropoulos ...... H01L 27/156
(Continued)

FOREIGN PATENT DOCUMENTS

EP      0549278 B1   6/1993
EP      2110904 A1  10/2009
(Continued)

OTHER PUBLICATIONS

International Search Report and Written Opinion for International Application No. PCT/US2020/060404, dated Mar. 1, 2021, 12 Pages.

(Continued)

*Primary Examiner* — Bilkis Jahan
(74) *Attorney, Agent, or Firm* — Weaver Austin Villeneuve & Sampson LLP

(57) ABSTRACT

Disclosed herein are methods, systems, and apparatuses for an light emitting diode (LED) array apparatus. In some embodiments, the LED array apparatus may include a plurality of mesas etched from a layered epitaxial structure. The layered epitaxial structure may include a P-type doped semiconductor layer, a active layer, and an N-type doped semiconductor layer. The LED array apparatus may also include one or more regrowth semiconductor layers, including a first regrowth semiconductor layer, which may be grown epitaxially over etched facets of the plurality of mesas. In some cases, for each mesa, the first regrowth semiconductor layer may overlay etched facets of the P-type doped semiconductor layer, the active layer, and the N-type
(Continued)

doped semiconductor layer, around an entire perimeter of the mesa.

9 Claims, 18 Drawing Sheets

(56) References Cited

U.S. PATENT DOCUMENTS

| | | | | |
|---|---|---|---|---|
| 11,424,289 | B2* | 8/2022 | Tyagi | H01L 33/0062 |
| 2016/0197232 | A1* | 7/2016 | Bour | H01L 33/06 |
| | | | | 257/13 |
| 2017/0012175 | A1* | 1/2017 | Wang | H01L 33/38 |
| 2018/0097145 | A1 | 4/2018 | Bour et al. | |
| 2019/0088820 | A1* | 3/2019 | Danesh | H01L 33/62 |

FOREIGN PATENT DOCUMENTS

| | | |
|---|---|---|
| JP | 2011 114155 | 6/2011 |
| WO | WO-0045443 A1 | 8/2000 |
| WO | WO-2015099944 A1 | 7/2015 |
| WO | WO-2018005286 A1 | 1/2018 |
| WO | 2020205761 A1 | 10/2020 |

OTHER PUBLICATIONS

R. M. Von Würtemberg, et al., "A Novel Electrical and Optical Confinement Scheme for Surface Emitting Optoelectronic Devices," Proceedings of SPIE, vol. 6350, Jul. 6, 2006, pp. 63500J1-63500J10, XP040230578.

Non-Final Office Action dated Jan. 3, 2022 for U.S. Appl. No. 17/096,764, filed Nov. 12, 2020, 15 pages.

PCT Application No. PCT/US2020/025762, "International Search Report and Written Opinion", dated Jun. 26, 2020, 12 pages.

Carlos Angulo Barrios "Gallium arsenide based Buried Heterostructure Laser Diodes with Aluminium-free Semi-Insulating materials Regrowth" Laboratory of Semiconductor Materials Department of Microelectronics and Information Technology Royal Institute of Technology Electrum 229, S-164 40 Kista, Stockholm, Sweden, Sep./Oct. 2002, 109 pages.

Notice of Allowance dated Apr. 19, 2022 for U.S. Appl. No. 17/096,764, filed Nov. 12, 2020, 8 pages.

* cited by examiner

REGROWTH OF EPITAXIAL LAYER FOR SURFACE RECOMBINATION VELOCITY REDUCTION IN LIGHT EMITTING DIODES

CROSS-REFERENCE IN NON-PROVISIONAL CONVERSION

This patent application claims benefit of and priority to U.S. Provisional Patent Application Ser. No. 62/826,683, filed Mar. 29, 2019, entitled "REGROWTH OF EPITAXIAL LAYER FOR SURFACE RECOMBINATION VELOCITY REDUCTION IN LIGHT EMITTING DIODES," which is assigned to the assignee hereof and is hereby incorporated by reference in its entirety for all purposes.

BACKGROUND

Aspects of the disclosure relate to the design of light emitting diodes (LEDs). As the physical size of LEDs is reduced, efficiency losses due to surface recombination become ever more significant as a factor impacting overall performance. Etching mesas from a layered epitaxial structure often results in etched mesa facets that include surface imperfections. Such undesired features tend to increase surface recombination velocity and induce dark current, driving down the light converting efficiency of the LEDs. Techniques are needed to address the surface recombination problem exhibited in etched mesas, to improve LED efficiency.

BRIEF DESCRIPTION OF THE DRAWINGS

Aspects of the disclosure are illustrated by way of example.

DETAILED DESCRIPTION

The disclosure presents various embodiments in which a regrowth of an epitaxial layer is used to passivate the etched facets of an LED mesa, in a manner that provides an improved crystalline interface at the etched facets, to reduce dangling bonds and other surface imperfections. Doing so decreases current flow that is lost to non-radiative recombination associated with surface states, i.e., at or near the etched facets of the LED mesa. In other words, surface recombination velocity can be significantly reduced, and efficiency losses of the LED due to surface recombination can be greatly mitigated.

Figure 1:
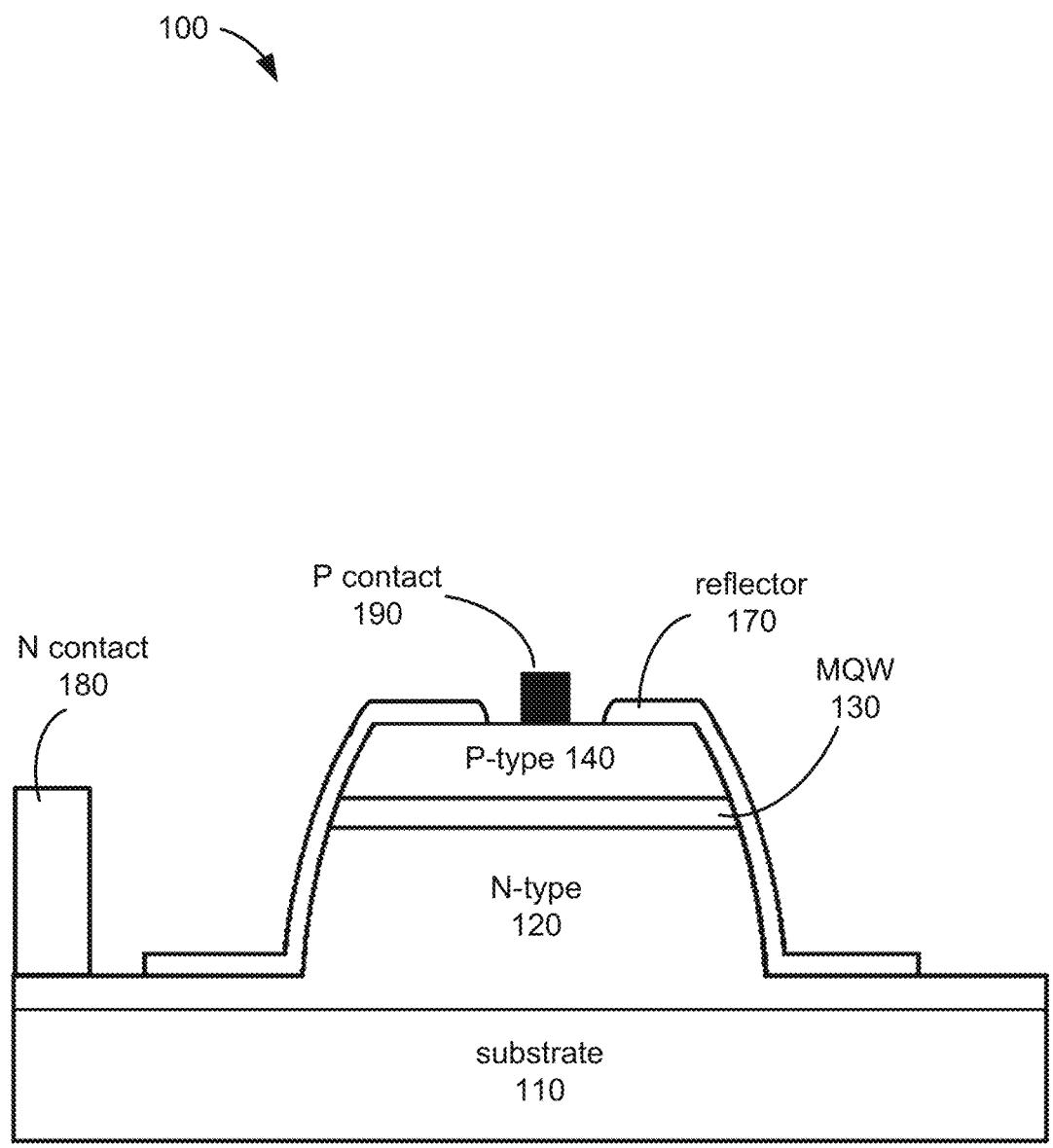
FIG. 1 illustrates a simplified diagram showing the basic components of an etched parabolic mesa configured as an LED.

FIG. 1 illustrates an example of an LED 100 including a parabolic mesa structure. According to embodiments of the disclosure, LED 100 emits incoherent light. LED 100 may be a micro-LED having a lateral dimension, or diameter, of less than 10 micrometer. LED 100 may be made of inorganic materials, such as multiple layers of semiconductor materials. For example, the layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb).

The layered semiconductor device may be manufactured by growing multiple epitaxial layers on a substrate, in one or more chambers, using techniques such as molecular beam epitaxy (MBE), metalorganic vapor-phase epitaxy (MOVPE), also known as organometallic vapor-phase epitaxy (OMVPE) or metalorganic chemical vapor deposition (MOCVD), or physical vapor deposition (PVD), such as pulsed laser deposition (PLD). For example, the semiconductor layers may be grown layer-by-layer on a substrate with a certain crystal lattice orientation, such as a sapphire, quartz, gallium nitride (GaN), gallium arsenide (GaAs), gallium phosphide (GaP). The silicon substrate may be cut in a specific direction to expose a specific plane as the growth surface.

LED 100 may include a substrate layer 110, which may include, for example, an aluminum oxide ($Al_2O_3$) substrate ("sapphire" substrate) or a GaN substrate. A semiconductor layer 120 may be grown on substrate layer 110. Semiconductor layer 120 may include a Group III-V material, such as GaN, and may be p-doped (e.g., with Mg, Ca, Zn, or Be) or n-doped (e.g., with Si or Ge). In the example shown in FIG. 1, layer 120 is an N-type doped semiconductor material. One or more active layers 130 may be grown on semiconductor layer 120. Active layers 130 may include one or more indium gallium nitride (InGaN) layers, one or more aluminum indium gallium phosphide (AlInGaP) layers, or one or more GaN layers, which may form one or more heterostructures, such as one or more quantum wells. Here, active layers 130 comprise a multiple quantum wells (MQW) layer. A semiconductor layer 140 may be grown on active layers 130. Semiconductor layer 140 may include a III-V material, such as GaN, and may be p-doped (e.g., with Mg, Ca, Zn, or Be) or n-doped (e.g., with Si or Ge). In the example shown in FIG. 1, layer 140 is a P-type doped semiconductor material. Semiconductor layer 120 and semiconductor layer 140 sandwich active layers 130 to form the light emitting diode. For example, LED 100 may include a layer of InGaN situated between a layer of p-type GaN doped with magnesium and a layer of n-type GaN doped with silicon or oxygen. In some embodiments, LED 100 may include a layer of AlInGaP situated between a layer of p-type AlInGaP doped with zinc or magnesium and a layer of n-type AlInGaP doped with selenium, silicon, or tellurium.

To make contact with semiconductor layer 120 (e.g., an n-GaN layer) of the diode and to more efficiently extract light emitted by active layers 130 from LED 100, the semiconductor layers may be etched to expose semiconductor layer 120 and form a mesa structure that include layers 120-140. The mesa structure may confine carriers within the injection area of the device. Etching the mesa structure may lead to the formation of mesa side walls—also referred to herein as facets—that may be non-parallel with, or in some cases, orthogonal, to the growth planes. A reflective layer 170 may be formed on the side walls of the mesa structure. Reflective layer 170 may include an oxide layer, such as a silicon oxide ($SiO_2$) layer, and may act as a reflector to reflect emitted light out of LED 400. A contact 180, which may comprise a metal, such as Al, Au, Ni, Ti, or any combination thereof, or a non-metal conductive material, shown as a N contact in this figure, may be formed on semiconductor layer 120 and may act as an electrode of LED 100. In addition, another contact 190, such as an Al/Ni/Au metal layer, shown as an P-contact in this figure, may be formed to make ohmic contact with semiconductor layer 140 to act as another electrode of LED 100.

When a voltage signal is applied to contact layers 180 and 190, electrons and holes may recombine in active layers 430, where the recombination of electrons and holes may cause photon emission. The wavelength and energy of the emitted photons may depend on the energy bandgap between the valence band and the conduction band in active layers 130. For example, InGaN active layers may emit green or blue light, while AlInGaP active layers may emit red, orange, yellow, or green light. The emitted photons may be reflected by reflective layer 170 and may exit LED 100, for example, from the bottom side (e.g., substrate 110) shown in FIG. 1.

In some embodiments, the LED 100 may include a mesa of another shape, such as a planar, vertical, conical, semi-parabolic, or parabolic shape, where a base area of the mesa may be circular, rectangular, hexagonal, or triangular. For example, the LED may include a mesa of a curved shape (e.g., paraboloid shape) and non-curved shape (e.g., conic shape). The mesa may be truncated or non-truncated.

Figure 2A:
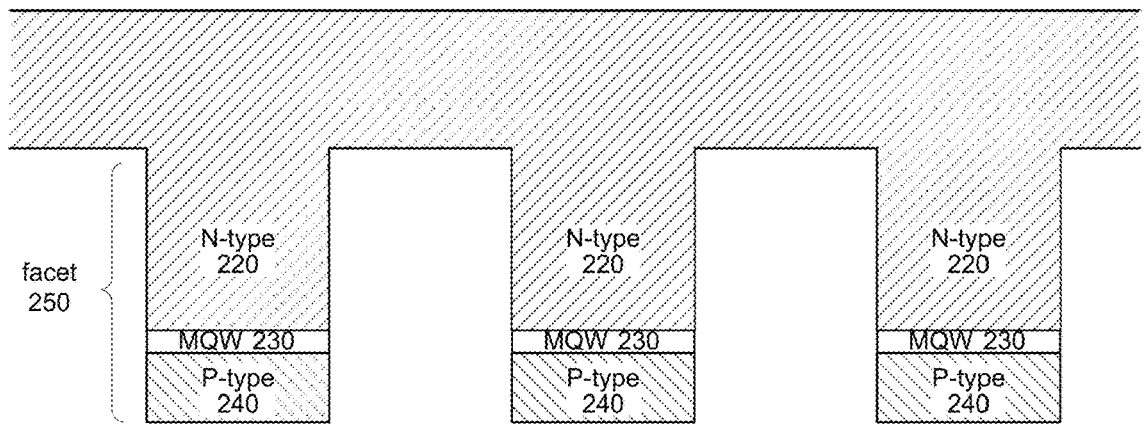
FIG. 2A illustrates a plurality of vertical mesas.

FIG. 2A illustrates a plurality of vertical mesas 200A. In contrast to the parabolic shape of the mesa shown in FIG. 1, the mesas 200A shown in FIG. 2A have vertically oriented side walls, or facets. The orientation of the mesas 200A have also been flipped in FIG. 2A compared to FIG. 1. Here, light from each LED exits the mesa structure from the "top" side of the figure. The plurality of mesas 200A shown in FIG. 2A may form an array of LEDs that contribute light for a display. For example, light for each mesa may contribute light for one pixel, or one color of a pixel, of a display.

Each of the mesas 200A may be a light emitter in light source. In some embodiments, mesas 200A may be micro-LEDs made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 2A, each of mesas 200A may include a N-type doped semiconductor layer 220 and a P-type doped semiconductor layer 240. The N-type doped semiconductor layer 220 may include a III-V material, such as GaN, and may be p-doped (e.g., with Mg, Ca, Zn, or Be) or n-doped (e.g., with Si or Ge). The P-type doped semiconductor layer 240 may include a III-V material, such as GaN, and may be p-doped (e.g., with Mg, Ca, Zn, or Be) or n-doped (e.g., with Si or Ge). One or more multiple quantum well (MQW) layers 230 may be grown between the N-type doped semiconductor layer 220 and the P-type doped semiconductor layer 240 to form an active region. MQW layers 230 may also be referred to herein as an active layer or active layers. In some embodiments, MQW layers 230 may be or include one or more quantum dot (QD) or quantum wire (QWire) layers. The active region formed by MQW layers 230 may form the light emitting region of the mesas 200A.

MQW layer 330 may include III-V materials, such as one or more InGaN layers, one or more AlInGaP layers, and/or one or more GaN layers, which may form one or more heterostructures. In exemplary embodiments, each of mesas 200A may include a layer of InGaN situated between a layer of P-type GaN doped with magnesium and a layer of N-type GaN doped with silicon or oxygen. In other embodiments, each of mesas 200A may include a layer of AlInGaP situated between a layer of P-type AlInGaP doped with zinc or magnesium and a layer of N-type AlInGaP doped with selenium, silicon, or tellurium.

In some embodiments not shown, mesas 200A may include a substrate, which may include, for example, a sapphire substrate or a GaN substrate. Additional components such as P-contacts, N-contact, reflector layers, conductive layers etc. may be present, however, are not explicitly shown for ease of illustration.

While FIG. 2A presents a cross-sectional view, the array of mesas 200A may comprise a two-dimensional array of mesas, each corresponding to an LED device. As mentioned previously, each LED may have a lateral dimension, or diameter, of less than 10 micrometers. From a plan view, or top-down view, the void or trench between two adjacent mesas may be in the range of 0.05 to 7 micrometers, according to various embodiments. This supports a wide range of pitch distances, i.e., the center-to-center distance between two adjacent mesas. The number of mesas included in an array may vary. In various embodiments, the number of mesas along a first dimension may be in the thousands, and the number of mesas along a second dimension may also be in the thousands. Just as an example, an array may comprise 1,500 mesas by 1000 mesas. In another example, an array may comprise 2,000 mesas by 1,500 mesas.

Figure 2B:
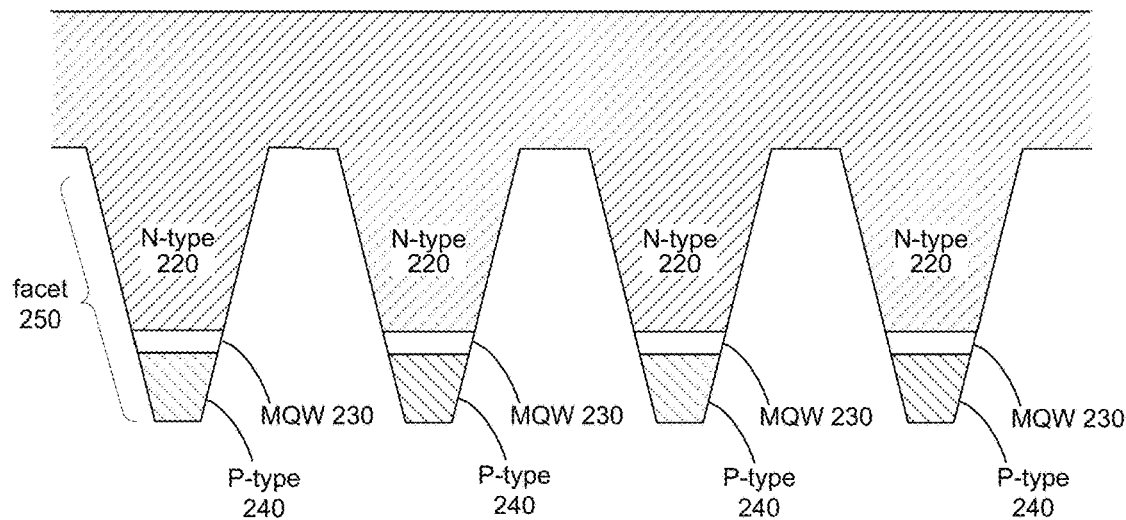
FIG. 2B illustrates a plurality of mesas having a trapezoidal profile.

While FIG. 2A illustrates an example of vertical mesas associated with cylindrical three-dimensional shapes, other shapes are possible. Just as an example, FIG. 2B illustrates a plurality of mesas 200B having a trapezoidal profile. The mesas 200B may be the same as mesas 200A except for the shape of each of the mesas. Other types of mesas are also possible, including those having more complex profiles such as a combination of shapes, such as a combination of rectangular and a trapezoidal profile(s). As shown, both mesas 200A and 200B form facets 250 along a surface of each of the mesas. Use of regrowth semiconductor layers on the facet of mesas to reduce non-radiative recombination may be adopted for mesas of different shapes and profiles, according to various embodiments of the disclosure.

Surface imperfections on the facets 250 of each mesa may contribute to undesirable surface recombination that decreases the efficiency of each LED. At the facets 250, the atomic lattice structure of the N-type doped semiconductor layer 220 and P-type doped semiconductor layer 240 comes to an abrupt end. At these surfaces, atoms of the semiconductor material lack neighbors to which bonds may be attached. This results in "dangling bonds," which are characterized by unpaired valence electrons. These dangling bonds create energy levels within the bandgap of the semiconductor material that otherwise would not exist, causing non-radiative electron-hole recombination at or near the surface of the semiconductor material. A measure of the ease with which such recombination occurs is the surface recombination velocity (SRV). Increased SRV is thus associated with non-radiative recombination, i.e., recombination of electrons and holes without producing photons, which reduces the efficiency of the LED.

The effects of non-radiative recombination are especially pronounced as the physical size of each mesas is reduced to diameters of 10 micrometers and below, and more specifically, to 5 microns and below. In larger LED devices, e.g., diameters greater than 50 micrometers, the LED regions affected by surface recombination is proportionally small. For example, assuming a diffusion length of 1 micrometer, the effects of surface recombination may be limited to those areas within approximately 1 micrometer of the mesa facets. For a device having a diameter of 50 micrometers, only a small fraction of the interior of the device is within 1 micrometer of the device surface—i.e., mesa facet. The region of the device affected by surface recombination does not add up to a significant portion of span of the MQW layers 230. In other words, desirable, radiative recombination (which release photons) at the MQW layer 230 dominate the percentage of overall occurrences of recombination for the LED device. By contrast, for a device having a very small physical size, e.g., 2 micrometers in diameter, the region affected by surface recombination, assuming a diffusion length of 1 micrometer, may be quite significant. In such a case, a large percentage of the overall occurrences of recombination may be impacted by effects of non-radiative surface recombination near the mesa facets. Thus, the potential for efficiency degradation is especially acute for micro-LEDs.

To exacerbate the problem, LEDs generally cannot be operated at current densities high enough to circumvent the problems associated with high surface recombination velocity. The diffusion length of a given material may vary depending on the current density at which the device is operated. A higher current density (e.g., in units of amps/$cm^2$) is associated with lower surface recombination velocity. Theoretically, surface recombination velocity can be reduced by increasing current density. For example, a LASER device may be operated at a high current density, e.g., in the Kamps/$cm^2$ range, to drive down surface recombination velocity. By contrast, an LED device generally cannot be operated at such high current densities. Instead, LED devices typically operate in the range of 1-100 amps/$cm^2$. As such, operation at very high current densities may not be feasible, and the need is even greater for alternative strategies for reducing surface recombination velocity in LED devices. According to various embodiments of the present disclosure, one or more regrowth semiconductor layers on the faces of micro-LEDs may be used to reduce surface recombination velocity and significantly improve LED efficiency.

Figure 3:
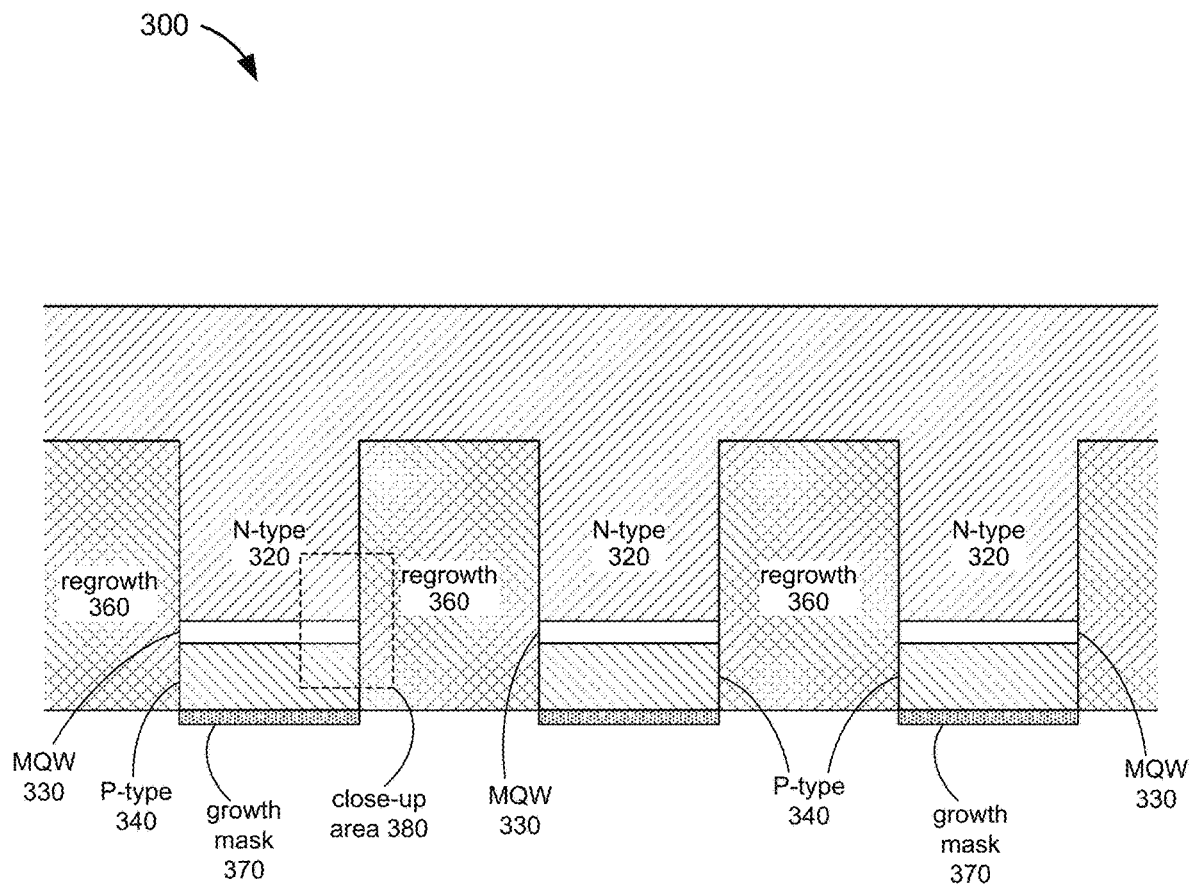
FIG. 3 illustrates a regrowth semiconductor layer grown as an additional epitaxial layer over etched facets of a plurality of mesas, according to an embodiment of the disclosure.

FIG. 3 provides a plurality of mesas 300 having a regrowth semiconductor layer 360 grown as an additional epitaxial layer over etched facets of the plurality of mesas 300, according to an embodiment of the disclosure. The plurality of mesas 300 may be or include similar materials to those of mesas 200A and 200B. For example, mesas 300 may each include a N-type doped semiconductor layer 320, a P-type doped semiconductor layer 340, and a MQW layer 330 grown between the N-type doped semiconductor layer 320 and the P-type doped semiconductor layer 340.

In the present embodiment, the regrowth semiconductor layer 360 overlays and is in contact with etched facets of the P-type doped semiconductor layer 340, the MQW layer 330, and the N-type doped semiconductor layer 320 around an entire perimeter of the mesa. For example, each vertical mesa shown in FIG. 3 may have a generally cylindrical shape. Thus, the regrowth semiconductor layer 360 may fully surround each vertical mesa, such that the perimeter sidewalls of cylindrical shape of each mesa is overlaid with the regrowth semiconductor layer 360. The cross-sectional view presented in FIG. 3 illustrates such an arrangement. In the particular embodiment shown in this figure, the regrowth semiconductor layer 360 completely fills the voids between adjacent mesas.

Growth of the regrowth semiconductor layer 360 may be performed using various technique including, for example, molecular beam epitaxy (MBE), metalorganic vapor-phase epitaxy (MOVPE), or physical vapor deposition (PVD), such as pulsed laser deposition (PLD). However, the general strategy of growing the regrowth semiconductor layer 360 as an additional epitaxial layer over etched surfaces of a mesa to reduce surface recombination velocity is not necessarily limited to a particular growth technique such as MBE or MOVPE.

Various surface preparation techniques may be used to remove imperfections or otherwise improve the condition of the mesa facet surface for epitaxial regrowth. These surface preparations may include plasma cleaning, thermal desorption in high-vacuum or ultra-high vacuum, $H_2$, $NH_3$, phosphine, arsine overpressure at high temperature, in-situ $Cl_2$ etch, etc. In the case of MOCVD, surface preparation technique may include, for example, annealing at high temperatures (e.g., at ranges around 900 degrees Celsius). In the case of MBE, surface preparation technique may include, for example, (1) in-situ cleaning using hydrogen $H_2$ gas and/or annealing in ultra-high vacuum (UHV), e.g., at pressures lower than $10^{-7}$ Pascal, and (2) gallium (Ga) flash-off or Ga polish.

In addition to cleaning and removal of materials, the surface may also be reconstructed. For example, pressurized treatment with a Group V material with an extended high temperature step close to the growth temperature of the regrowth material may be used, in order to build an ordered surface. The progress of surface reconstruction may be monitored using in-situ techniques such as reflection high-energy electron diffraction (RHEED) or ellipsometry (SE). A rapid quench step may also be used and/or the temperature may be increased for the subsequent deposition steps.

Regrowth masks 370 may be employed to ensure area-selective growth. As shown in FIG. 3, a regrowth mask 370 may be deposited on top of each mesa (shown on the bottom side of FIG. 3 because the orientation of the mesas is "flipped" in the figure) prior to the regrowth step. While not shown in FIG. 3 and subsequent figures, a P-contact layer may exist on the P-type doped semiconductor layer 340. The regrowth masks 370 may be deposited over such a P-contact layer (e.g., metal layer). According to various embodiments, the regrowth mask 370 may comprise a material such as $SiO_2$ or $SiN_x$. Regrowth masks 370 ensure that the regrowth semiconductor layer 360 is only grown at selected locations. After one or more regrowth semiconductor layers 360 are established, the regrowth masks 370 may be etched away. Additionally or alternatively, other techniques may be used to remove unwanted or excessive regrowth material from locations where regrowth is not desired. Such removal techniques may include planarization, e.g., chemical mechanical planarization (CMP).

Epitaxial growth of the one or more regrowth semiconductor layers 360 may be designed to take many factors into account. In some cases, the materials may induce local strain at the regrowth interface. In other cases, the initial layers of growth may become diffuse. The one or more regrowth semiconductor layers 360 maybe configured for:

energy landscape (e.g. a large bandgap material next to the original crystal);

defect density to reduce non-radiative recombination;

electrostatic control through doping (induces band bending in original materials to make minority carrier transport into interface traps unlikely);

lattice matching to original material (e.g., wurtzite on wurtzite or 001 wurtzite on 111 zincblende materials); and/or environmental sensitivity (e.g. Al free surfaces to prevent oxidation, or finish with Al surfaces and purposefully oxidized in following steps).

According to some embodiments, the one or more regrowth semiconductor layers 360 may comprise a wide-bandgap (WBG) semiconductor material and/or a narrow band-bandgap (NGB) semiconductor material. Here, WBG refers to semiconductor materials which have a relatively large bandgap, e.g., in the range of 2-4 electronvolts (eV). NGB refers semiconductor materials with have a relatively small bandgap, e.g., less than 1.11 eV. Conventional semiconductors such as silicon that have a bandgap in the range of 1-1.5 eV. In some embodiments, the regrowth semiconductor layer 360 may comprise an undoped semiconductor material. In other embodiments, the regrowth semiconductor layer 360 may comprise a doped semiconductor material. The regrowth semiconductor layer 360 may also comprise a "lightly doped" semiconductor material. For example, the regrowth semiconductor layer 360 may have a dopant concentration that is significantly lower than that of the N-type doped semiconductor layer 320 (or P-type doped semiconductor layer 340). In various embodiments, the regrowth semiconductor layer 360 may comprise a material selected from: aluminum nitride (AlN), aluminum gallium nitride (AlGaN), aluminum gallium arsenide (AlGaAs), aluminum indium phosphide (AlInP), aluminum gallium indium phosphide (AlGaInP) with a higher aluminum content than the active layer, or zinc oxide (ZnO).

According to various embodiments of the disclosure, the material of regrowth semiconductor layer 360 may be selected to match or resemble the material of the N-type doped semiconductor layer 320 and/or the P-type doped semiconductor layer 340 of the LED, such that a "perfect" or near perfect crystalline interface is achieved. Similar materials allow for a consistent lattice structure to be continued over the interface between the regrowth semiconductor layer 360 and the N-type doped semiconductor layer 320 (or the interface between the regrowth semiconductor layer 360 and the P-type doped semiconductor layer 340) of the etched mesa structure. Such an interface minimizes the occurrence of dangling bonds, to effectively reduce surface recombination velocity (SRV). For instance, if the N-type doped semiconductor layer 320 and P-type doped semiconductor layer 340 comprise III-V semiconductor materials, the regrowth semiconductor layer 360 may also comprise III-V semiconductor materials.

Growth conditions for the one or more regrowth semiconductor layers 360 may be different than the growth conditions for the N-type doped semiconductor layer 320 and P-type doped semiconductor layer 340 of the etched mesa structure of the LED. The N-type doped semiconductor layer 320 and P-type doped semiconductor layer 340 of the LED are grown in an upward direction from the substrate layer (e.g., substrate layer 110 in FIG. 1). By contrast, the regrowth semiconductor layer 360 is mainly grown in a lateral direction, outward from the facets of the mesa structure. Thus, growth conditions for the regrowth semiconductor layer 360 may be optimized to increase lateral growth rate, as opposed to an upwards growth rate with respect to the substrate layer. Optimizing for lateral growth rate may be accomplished by controlling factors such as the molecular composition of the regrowth semiconductor layer 360, e.g., the ratio of Group III to Group V elements in the material ("III/V ratio"), the temperature at which regrowth occurs, and by aligning offcut to the growth plane.

For example, materials chosen for the one or more regrowth semiconductor layers 360 may include Group III-AsP or Group III-N materials, including AlInGaP, AlInGaP(As), AlInGaPN, AlInGaN, (B)AlInGaN. These materials may also be doped using additives such as Si, Mg, C, Te, etc. In other examples, materials chosen for the one or more regrowth semiconductor layers 360 may include Group II-VI materials such as ZnS and ZnO. The materials may be deposited with growth conditions that may be different from typical growth plane growth conditions, in order to:

1. change the relative growth rate on the exposed facets compared to the original facet of the material;
2. improve the quality of the material; and/or
3. build heterostructures with controlled thickness.

As an example, GaN may normally be grown with high $NH_3$ partial pressures in MOCVD in order to promote lateral growth and suppress growth in the 001 direction to obtain smooth films. However, according to an embodiment of the present disclosure, the regrowth layers/films 360 may instead be grown with substantially lower $NH_3$ partial pressures, in order to obtain smooth films on the sidewalls of a device (e.g., LED device) or suppress bridging when growing inside trenches with high aspect ratios. Examples of such trenches may be the voids between each of the mesas 200A and 200B shown in FIGS. 2A and 2B.

Figure 4:
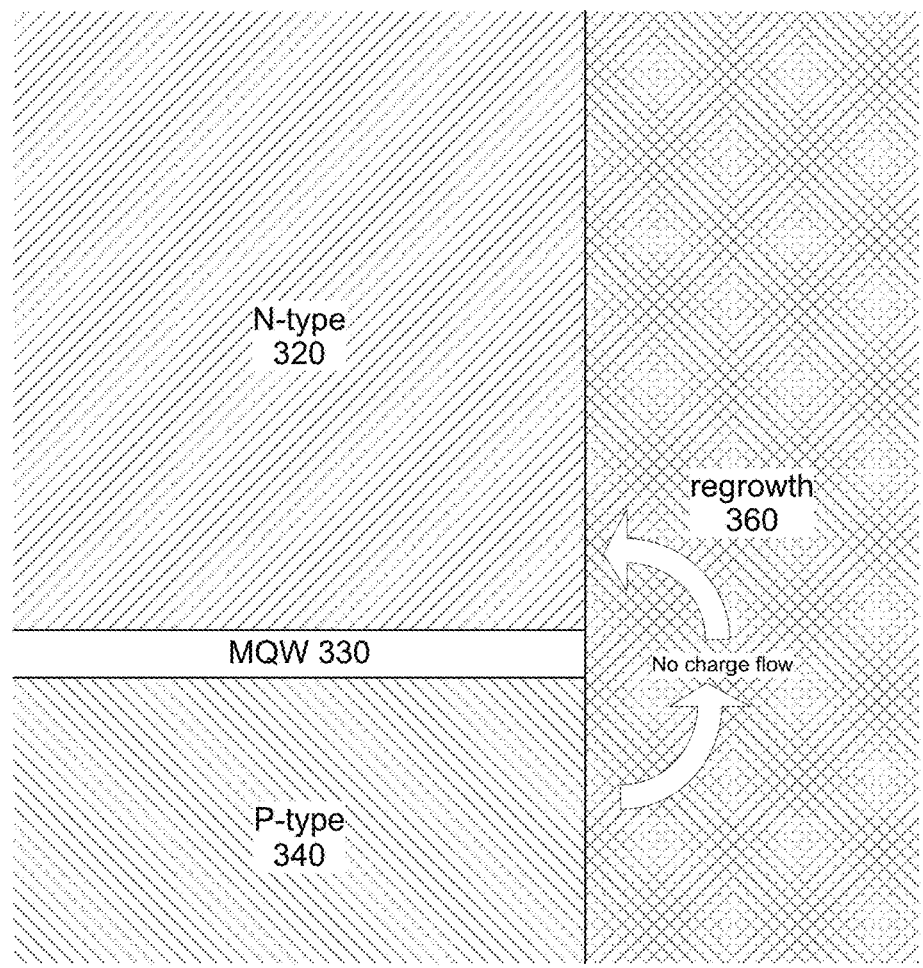
FIG. 4 depicts a close up area at a juncture of the N-type doped semiconductor material, multiple quantum wells layer, P-type doped semiconductor material, and a regrowth layer.

FIG. 4 depicts a magnified version of close-up area 380 depicted in FIG. 3. As shown, close-up area 380 illustrates a juncture of the N-type doped semiconductor layer 320, the MQW layer 330, the P-type doped semiconductor layer 340, and the regrowth layer 360. According to an embodiment, the regrowth layer 360 may comprise a doped semiconductor material. Here, the regrowth semiconductor layer 360 may be doped to attain a Fermi level associated with the regrowth semiconductor layer 360 acting as an insulator that prevents shorting out of the LED—i.e., preventing shorting caused by charge flow between the P-type doped semiconductor layer 340 and the N-type doped semiconductor layer 320 through the regrowth semiconductor layer 360.

For example, referring again to FIG. 4, if the N-type doped semiconductor layer 320 is used for the regrowth semiconductor layer 360, then the structure show in FIG. 4 may have a first p-n junction and potentially a second p-n junction. The first p-n junction is the LED itself; that is, the junction across the P-type doped semiconductor layer 340 and the MQW layer 330. The second p-n junction would potentially form across the P-type doped semiconductor layer 340 and the regrowth semiconductor layer 360 (which, in this example, comprises an N-type doped semiconductor material). However, materials and doping levels may be chosen for the various layers, thus controlling the respective Fermi levels, such that the turn-on voltage of the first p-n junction is significantly lower than the turn-on voltage of the second p-n junction. In the presence of charge potential, the first p-n junction would turn on, whereas the second p-n junction would not. That is, charges would flow with respect to the first p-n junction but not flow with respect to the second p-n junction. Thus, the regrowth semiconductor layer 360 would act as an insulator that prevents shorting of the LED.

Figure 5:
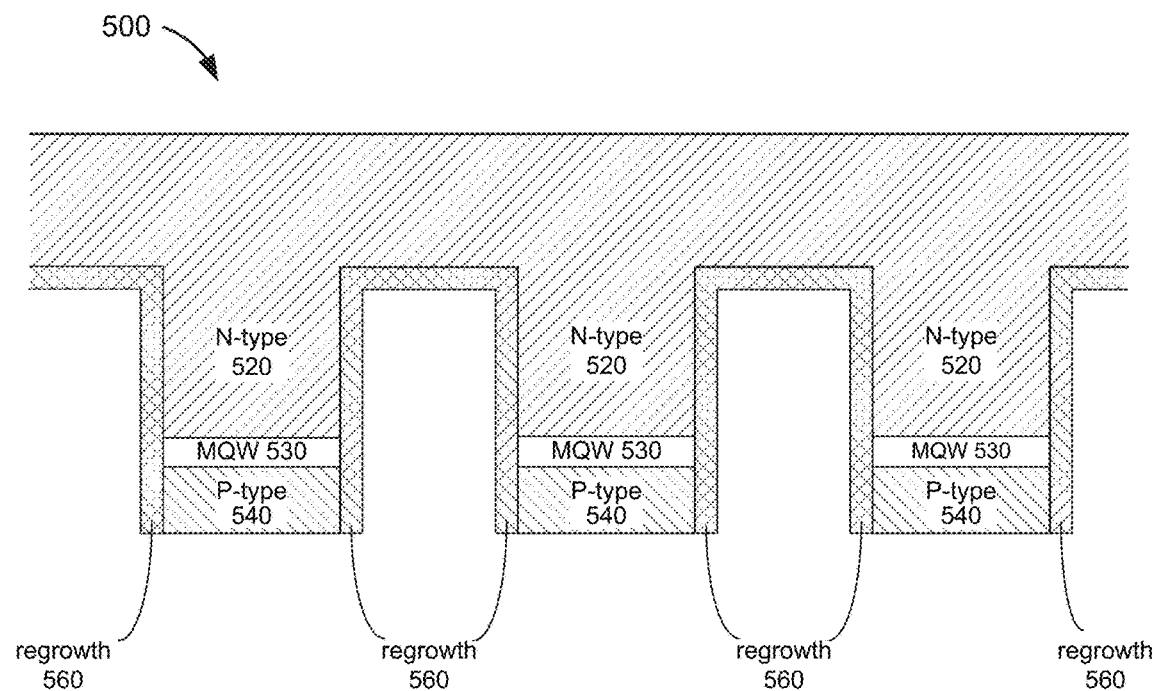
FIG. 5 illustrates a regrowth semiconductor layer partially filling voids between adjacent mesas, according to an embodiment of the disclosure.

FIG. 5 illustrates a mesa array 500 having a plurality of mesas having a regrowth semiconductor layer 560 partially filling voids between adjacent mesas, according to an embodiment of the disclosure. Here, while the voids between adjacent mesas are only partially filled, the regrowth semiconductor layer 560 nevertheless effectively passivates the exposed facets of the mesa structure. Once again, similar materials may be used to allow for a consistent lattice structure to be continued over the interface between the regrowth semiconductor layer 560 and the N-type doped semiconductor layer 520 (or the interface between the regrowth semiconductor layer 560 and the P-type doped semiconductor layer 520) of the etched mesa structure. This significantly reduces the occurrence of dangling bonds at the mesa facet, especially near the MQW, thus mitigating the detrimental effects of surface recombination.

The choice between completely filling and partially filling the voids between adjacent mesas may involve balancing the feasibility versus the performance gains associated with each approach. Factors that impact the feasibility and performance gains of the respective approaches include the pitch (i.e., center-to-center distance between adjacent mesas) and shape of the mesas.

Figure 6:
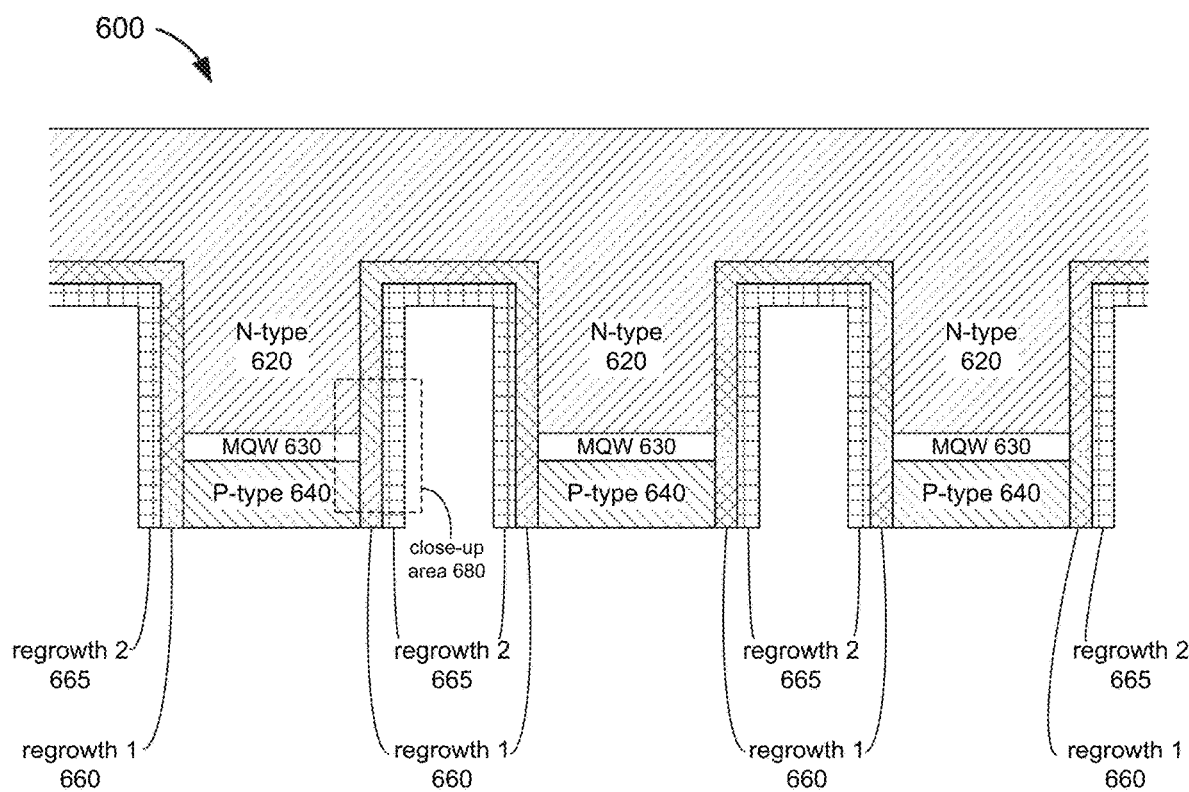
FIG. 6 illustrates a second regrowth semiconductor layer grown as a further epitaxial layer over a first regrowth semiconductor layer, according to an embodiment of the disclosure.

FIG. 6 provides an array of mesas 600 having a second regrowth semiconductor layer 656 grown as a further epitaxial layer over a first regrowth semiconductor layer 660, according to an embodiment of the disclosure. Thus, a heterogeneous regrowth structure may be achieved, by employing two or more different regrowth semiconductor layers. This may be referred to as a "heterostructure" variant of the regrowth semiconductor structure. The multiple regrowth semiconductor layers may comprise different materials. Just as an example, referring to FIG. 6, the first regrowth semiconductor layer 660 may comprise a wide-bandgap (WBG) material, and the second regrowth semiconductor layer 665 may comprise a narrow-bandgap (NBG) material. In this example, the WBG material may provide an insulating function to prevent the regrowth semiconductor layers from serving as a conduit for the movement of charges between the P-type doped semiconductor layer 640 and the N-type doped semiconductor layer 620 of the LED. The WBG material may further provide a passivation function to avoid dangling bonds at the mesa facet, thus significantly reducing surface recombination velocity.

According to certain embodiments, the WBG material of first regrowth semiconductor layer 660 may be undoped, P-type doped, or N-type doped. The NBG material of the second regrowth semiconductor layer 665 may be undoped, P-type doped, N-type doped, or doped such that the material is in a mid-gap state. That is, by carefully controlling the Fermi level, even the NBG material may be designed to act as an insulator. Various combinations of such materials are possible. Some examples of such combinations are listed below.

| LED | $1^{st}$ Regrowth Layer (Wide bandgap) | $2^{nd}$ Regrowth Layer (Narrow bandgap) |
|---|---|---|
| Doped | Undoped | Undoped |
| Doped | Undoped | P |
| Doped | Undoped | N |
| Doped | Undoped | Mid-gap state (insulator) |
| Doped | P | Undoped |
| Doped | P | P |
| Doped | P | N |
| Doped | N | Undoped |
| Doped | N | P |
| Doped | N | N |

In a first specific embodiment, the first regrowth semiconductor layer 660 comprises a WBG material that is undoped, and the second regrowth semiconductor layer 665 comprises a NBG material that is at the mid-gap state. In a second specific embodiment, the first regrowth semiconductor layer 660 comprises a WBG material that is undoped, and the second regrowth semiconductor layer 665 comprises a NBG material that is at P-type doped. In a third specific embodiment, the first regrowth semiconductor layer 660 comprises a WBG material that is undoped, and the second regrowth semiconductor layer 665 comprises a NBG material that is at N-type doped.

An example of a heterostructure may be formed by depositing an environmentally sensitive un-doped WBG material first, followed by a NBG, less environmentally sensitive doped material as an electrostatic control layer. In a specific embodiment, 10-100 nm of aluminum arsenide (AlAs) may be deposited first, followed by 10-100 nm of gallium arsenide (GaAs) doped with silicon (Si).

Additionally, various techniques may be adopted to implement the multiple regrowth semiconductor layers. One such technique is delta doping. Delta doping involves the use of thin layers of high dopant concentration in the growth process, to achieve doping profiles that resemble delta functions. Delta doping may be achieved through growth-interrupted impurity deposition during molecular-beam epitaxy (MBE), for example.

Figure 7:
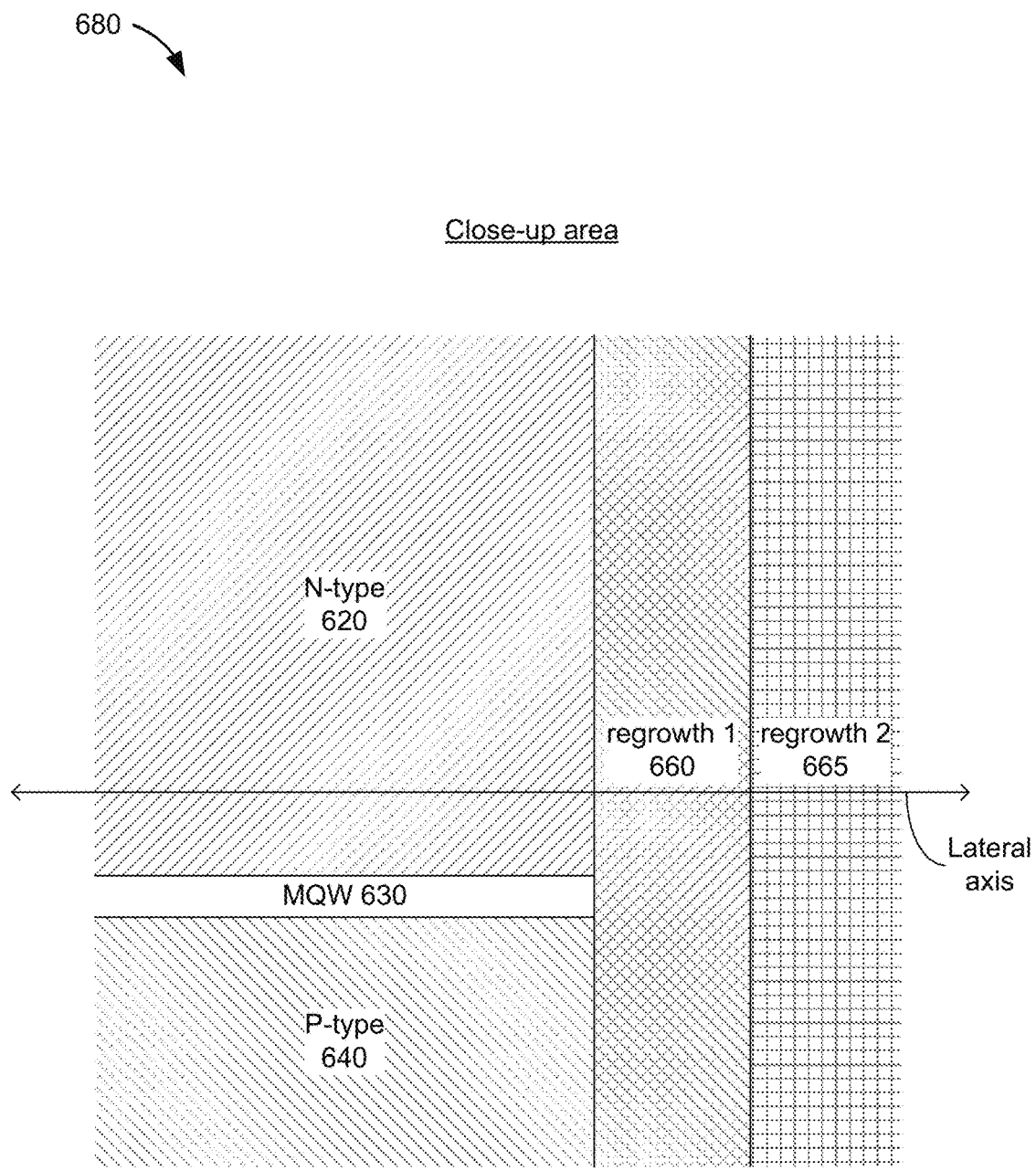
FIG. 7 depicts a close-up area at a juncture of the N-type doped semiconductor material, multiple quantum wells layer, and P-type doped semiconductor material of an LED, as well as a first regrowth layer and a second regrowth layer grown over facets of the LED.

FIG. 7 depicts the close-up area 680 as magnified from FIG. 6. The close-up area 680 illustrates a juncture of the N-type doped semiconductor layer 620, MQW layer 630, and the P-type doped semiconductor layer 640, as well as the first regrowth layer 660 and the second regrowth layer 665 grown over facets of the mesa structure. A lateral axis, or "cut line" may be envisioned as cutting across the N-type doped semiconductor layer 620 (or the P-type doped semiconductor layer 640) of the LED, the first regrowth layer 660, and the second regrowth layer 665.

Figure 8:
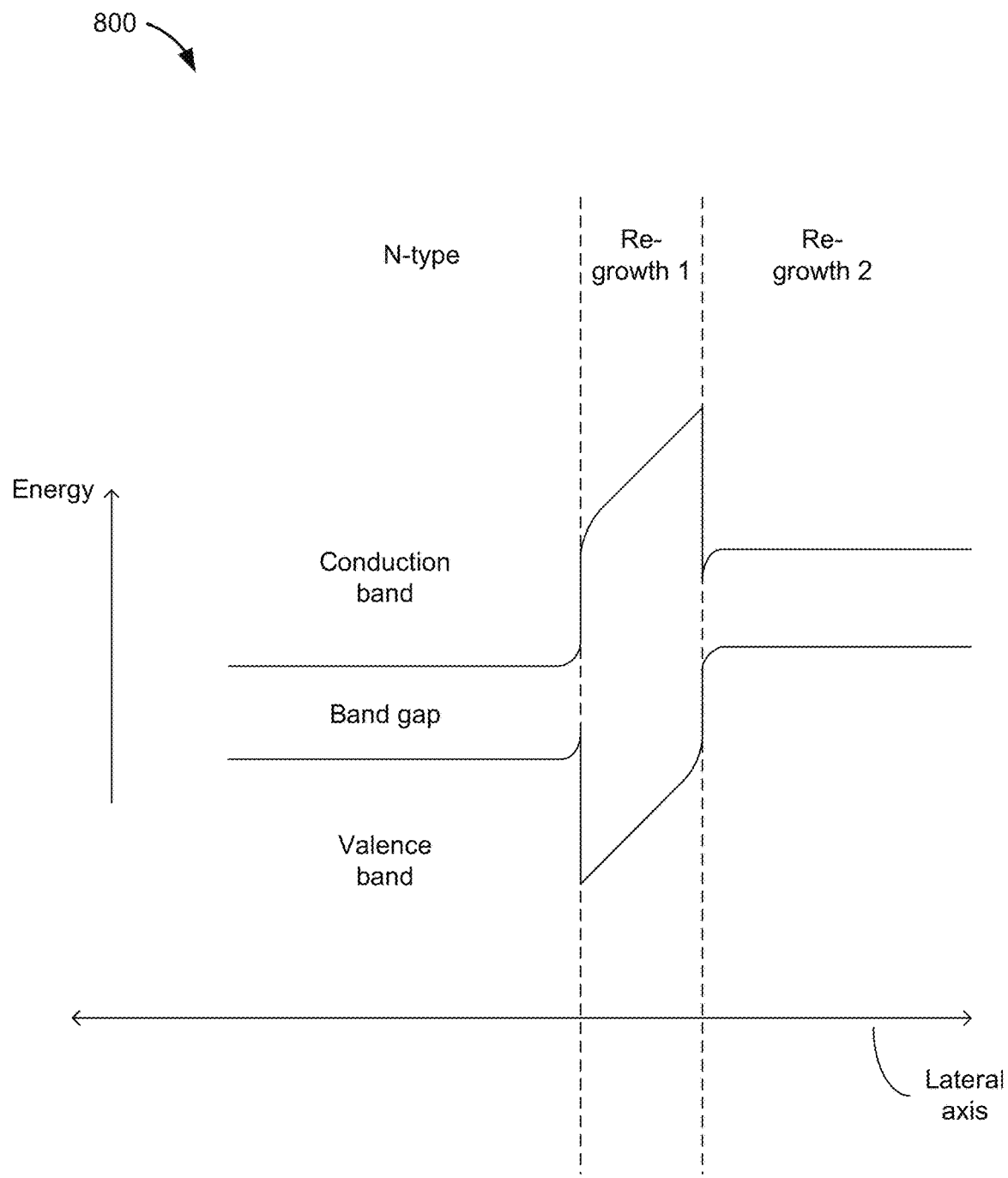
FIG. 8 is a band diagram along a lateral axis of the semiconductor structure shown in FIG. 7.

FIG. 8 provides a band diagram 800 for the semiconductor structure of the close-up area 680 shown in FIG. 7. Here, the x-axis is the same lateral axis show in FIG. 7 that cuts across different materials, such as the N-type doped semiconductor layer 620 (or the P-type doped semiconductor layer 640) of the LED, the first regrowth semiconductor layer 660, and the second regrowth semiconductor layer 665. The y-axis is the magnitude of the energy of an electron. As shown, the N-type doped semiconductor layer 620 of the LED may comprise a narrow-bandgap (NBG) material, characterized by a narrow gap between the lower boundary of the conduction band and the upper boundary of the valence band of the material. By contrast, and in accordance with an embodiment of the disclosure, the first regrowth semiconductor layer 660 may comprise a wide-bandgap (WBG) material, characterized by a wide gap between the lower boundary of the conduction band and the upper boundary of the valence band of the material. Furthermore, according to an embodiment of the disclosure, the second regrowth semiconductor layer 665 may comprise a NBG material, again characterized by a narrow gap between the lower boundary of the conduction band and the upper boundary of the valence band of the material.

According to various embodiments of the disclosure, the choice of the materials used for the different layers allows for electrostatic control to be achieved for the overall structure. In particular, the curvatures of the lower boundary of the conduction band and upper boundary of the valence band near the interfaces between adjacent materials may be controlled through the selection of the various materials.

Figure 9:
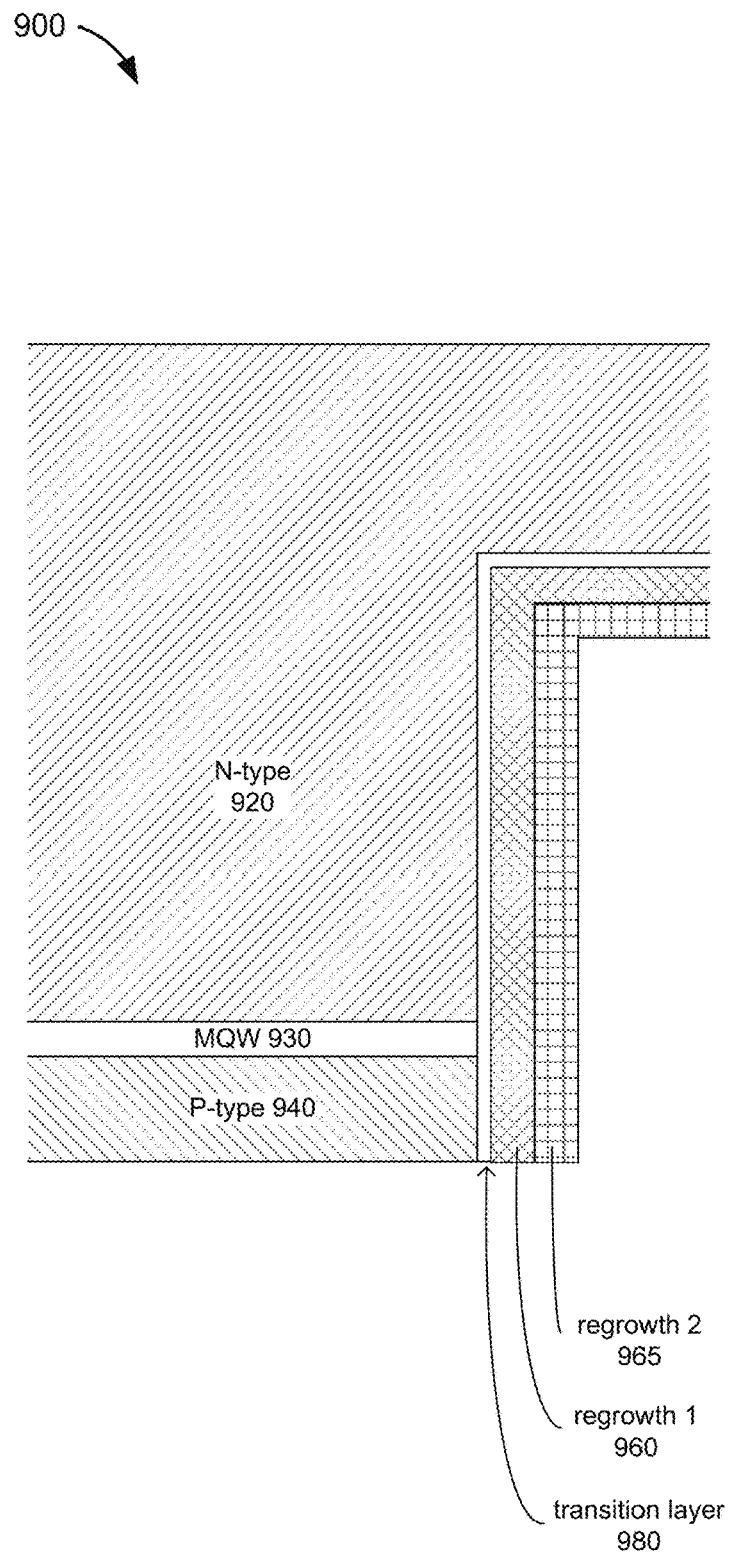
FIG. 9 illustrates a transition layer grown on the mesa facet to provide a smooth film before the first regrowth semiconductor layer is grown, according to embodiments of the disclosure.

FIG. 9 illustrates structure 900 providing a transition layer 980 grown on a mesa facet to provide a smooth film before a first regrowth semiconductor layer 960 is grown, according to embodiments of the disclosure. The transition layer 980 may also be considered one of the regrowth layers. Thus, in FIG. 9, the one or more regrowth semiconductor layers include the transition layer 980, the first regrowth semiconductor layer 960, and a second regrowth semiconductor layer 965. The first regrowth semiconductor layer 960 may be of similar make or material as the first regrowth semiconductor layer 660, and second regrowth semiconductor layer 965 may be of similar make or material as the second regrowth semiconductor layer 665. In certain instances, the material chosen for the first regrowth semiconductor layer 960 may be characterized by low mobility. For example, the first regrowth semiconductor layer 960 may comprise a material containing aluminum (Al), characterized by low mobility. That is, molecules of the material cannot travel very far once deposited and therefore cannot move to locations such as craters, etc., to filling depressions and even out an unsmooth surfaces. As a result, unevenness, i.e., undesirable surface features, tend to be repeated as a layer of the immobile regrowth material is deposited. To address this issue, a transition layer 980 having relatively high mobility may be deposited on the mesa facet, to provide a smooth surface on which the first regrowth semiconductor layer 960 may be grown. According to one embodiment, the transition layer 980 may comprise a moderately narrow-bandgap material.

In one embodiment, the first regrowth semiconductor layer 960 may comprise a wide-bandgap (WBG) material, the second regrowth semiconductor layer 965 may comprise a narrow-bandgap (NBG) material, and the transition layer 980 may comprise a material having a moderately narrow bandgap that is narrower than the WBG material of the first regrowth layer 960, but wider than the NBG material of the second regrowth layer 965. For example, the first regrowth semiconductor layer 960 may comprise aluminum gallium nitride ($Al_xGa_{1-x}N$), the second regrowth semiconductor layer 965 may comprise gallium nitride (GaN), and the transition layer 980 may comprise aluminum indium gallium nitride (AlInGaN). In this example, the transition layer 980 may be particularly useful when the aluminum (Al) content of the first regrowth layer 960 is greater than a particular threshold, e.g., when [AlN]>0.2 (that is, when x>0.2).

Figure 10:
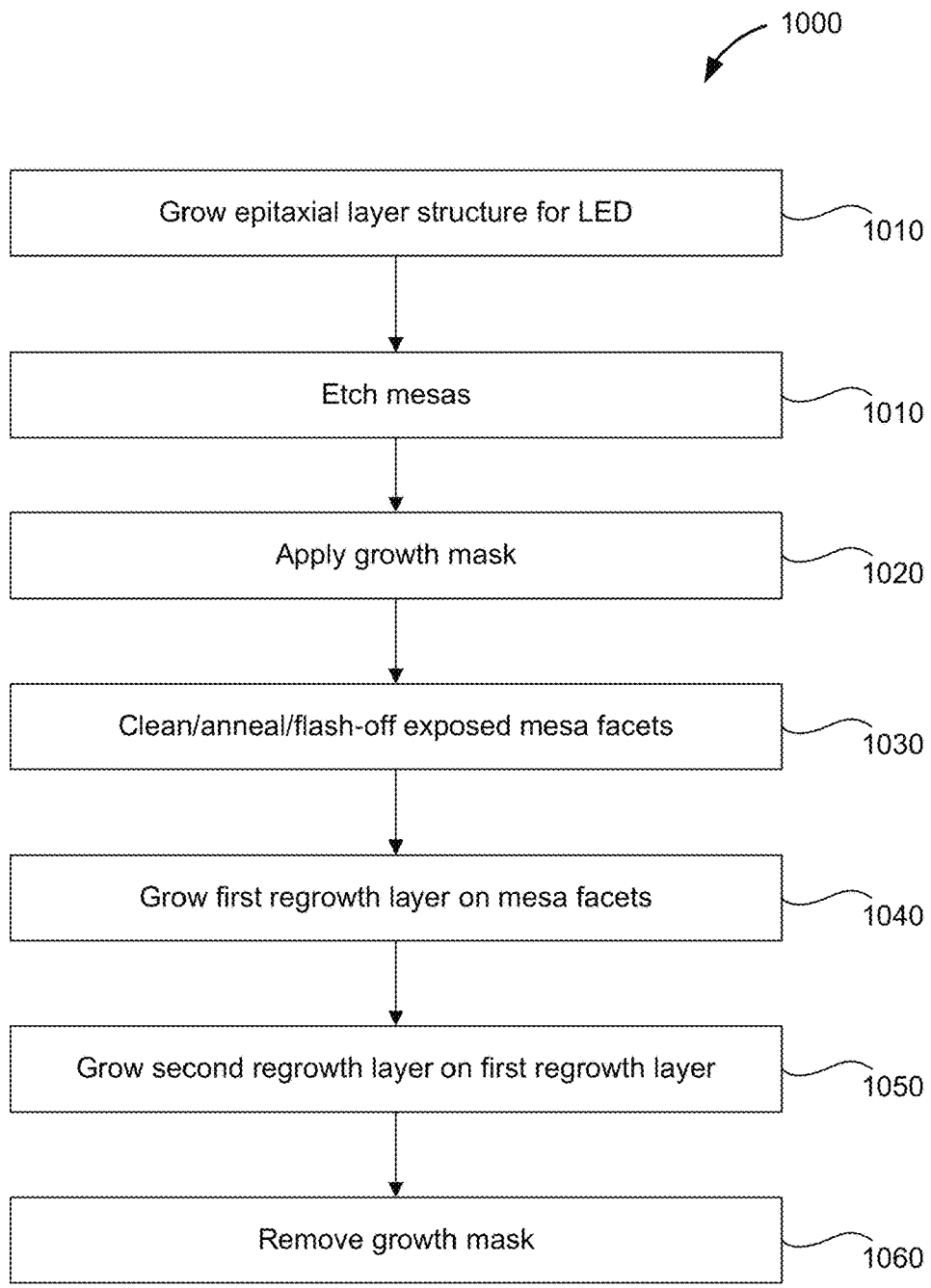
FIG. 10 is a flow chart presenting illustrative steps for regrowing epitaxial layer(s) over etched facets of a mesa configured as an LED, according to various embodiments of the disclosure.

FIG. 10 provides a flow chart presenting method 1000. Method 1000 provides illustrative steps for regrowing semiconductor layer(s), such as regrowth layers 360, 560, 660, 665, 960, and 965 over etched facets of a mesa configured as an LED, according to various embodiments of the disclosure. The following discussion of method 1000 is discussed with reference to FIGS. 11A, 11B, 12, 13A and 13B for illustrative purposes only.

Method 1000 may include step 1010. At step 1010 layers of an epitaxial structure for the formation of mesa structure of the LEDs may be grown on a substrate. For example, the layers may comprise an N-type doped semiconductor layer, such as N-type doped semiconductor layers 120, 220, 320, 520, 620, and 920, one or more MQW layers, such as MQW layers 130, 230, 330, 530, 630, and 930, and a P-type doped semiconductor layer, such as P-type doped semiconductor layers 140, 240, 340, 540, 640, and 940. Additional layers may also be formed. For instance, a conductive layer such as a P-metal layer may be formed on top of the P-type doped semiconductor layer At step 1020, an array of mesa shapes may be etched from the epitaxial structure, exposing mesa facets, such as facets 250. In some embodiments, an etch process, such as dry etching in an inductively coupled plasma (ICP) etch or reactive-ion etching (ME) system, may be used to etch the epitaxial structure. The etch may continue through a conductive layer (if present) and through one or more layers of the underlying epitaxial layers. For example, the etch may continue through an P-type doped semiconductor layer, through one or more MQW layers, and to a N-type doped semiconductor layer. The etch may stop somewhere within the N-type doped semiconductor layer, although in some application the etch may continue through the entirety of the N-type doped semiconductor layer and stop at the substrate. Optionally, in some embodiments, method 1000 may include a step for depositing a conductive layer onto the epitaxial structure or the mesa structures after etching.

At step 1030, a layer of regrowth masks, such as regrowth mask 370, may be formed on the tops of the mesas. These regrowth masks may be formed over a conductive layer if present, for example. In some embodiments, there may be more than one layer of regrowth masks. Exemplary mask layers may include a light sensitive material (e.g., a photoresist) and a hard mask material (e.g., $SiO_2$ or $Si_3N_4$).

Method 1000 may also include step 1040. Step 1040 may include one or more treatment steps, such as for example cleaning, annealing, and flash-off. Step 1040 may be performed before one or more regrowth semiconductor layers are grown on the etched epitaxial structure to remove subsurface damage and clean the regrowth surface. One or more treatment steps may be performed on the exposed mesa facets.

Figure 11A:
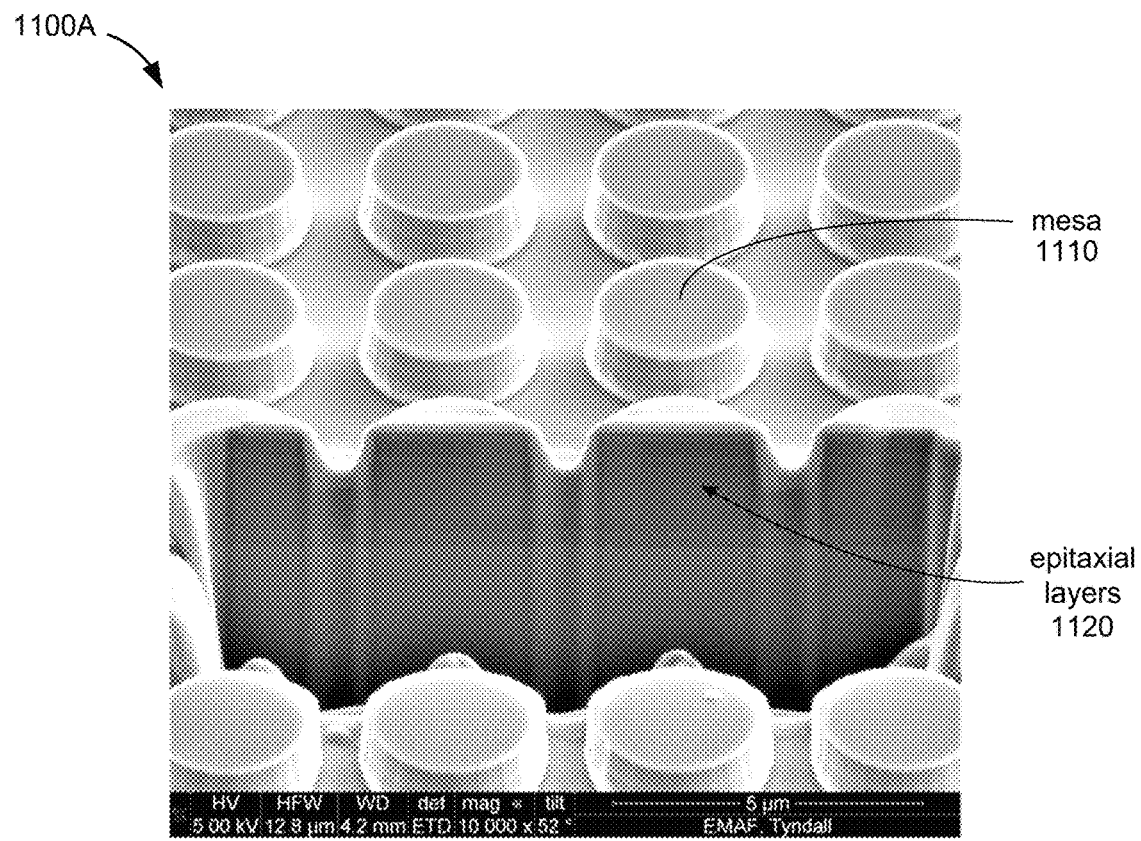
FIGS. 11A and 11B illustrate an array of mesas during an exemplary cleaning process that can be performed before growth of one or more regrowth semiconductor layers.
Figure 11B:
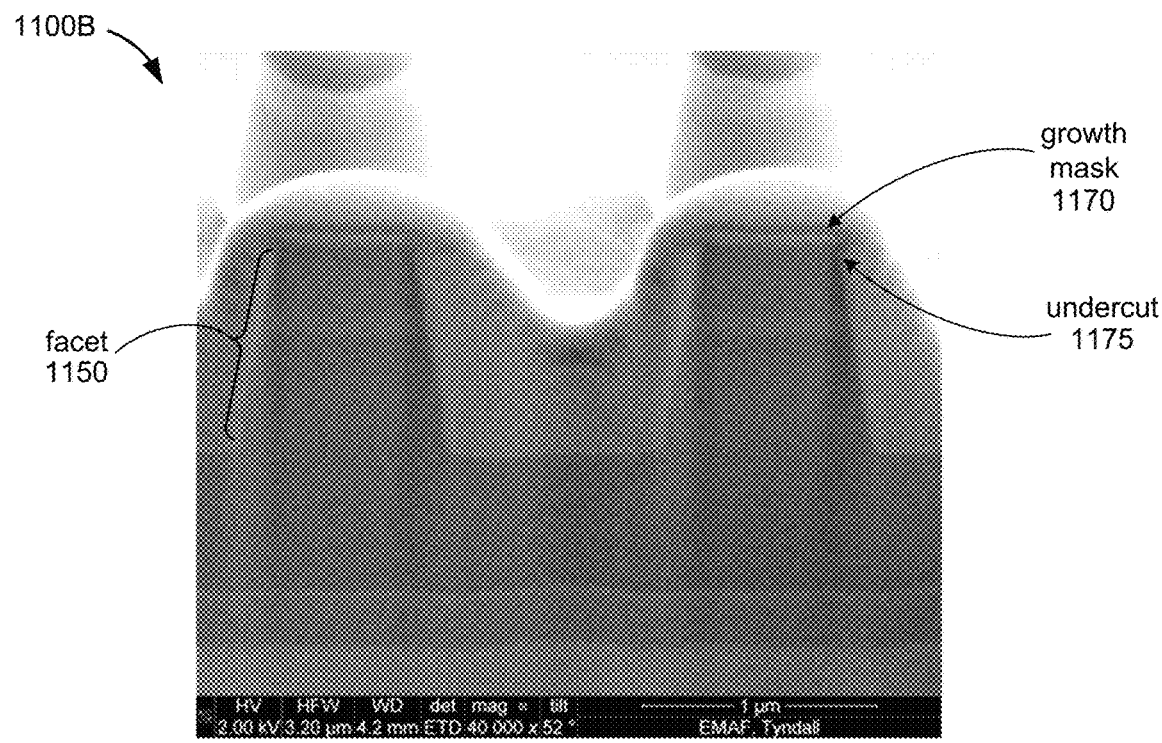

FIGS. 11A and 11B illustrate an exemplary cleaning process that can be performed before growth of one or more regrowth semiconductor layers. FIGS. 11A and 11B illustrate exemplary mesa shapes undergoing a subsurface damage removal and cleaning process. FIG. 11A provides image 1100A of an array of mesas 1110 during the cleaning process. FIG. 11B provides image 1100B which provides a close up view of two mesas 1110 from image 1100A. As illustrated by images 1100A and 1100B, each mesa 1110 includes etched epitaxial layers 1120 with facets 1150 formed thereon.

The cleaning process illustrated by images 1110A and 1110B is an improved wet etch cycle that removes subsurface damage on the mesa surface. The cleaning process provides a smooth mesa surface for subsequent growth of the one or more regrowth semiconductor layers. Cleaning the mesa surface, using wet etch cycles, a buffered oxide etch (BOE), or the like, removes oxide or oxygen-containing layers on the surface before regrowth and reduces surface traps at the hetero-interface. In some embodiments, a wet etch process may include digital etching in which approximately 0.5-20 nm of semiconductor material is controllably removed from the exposed mesa sidewalls. The cleaning process illustrated by images 1110A and 1110B shows mesa facets after a soft backetch and clean of the mesa surfaces via a BOE process. A BOE uses a wet etchant, such as a buffered etching solution, to controllably remove material from the mesa surface. For example, the cleaning process may include 20 wet etch cycles. During wet etch cycles, the surface of the mesa may exposed to surface oxidation to form an oxide layer overlaying the surface of the etched mesas 1110. The oxide layer may be less than 2 nm and is not visible in images 1110A and 1110B. After oxidation of the mesa surface, the oxide may be removed by wet etch or a gaseous etch, along with any subsurface damage.

As shown in image 1100B, a growth mask 1170 may be used to during the cleaning process to protect the mesa structure from undesirable etching. In some embodiments, growth mask 1170 may be the same as the regrowth mask applied at step 1030. In other embodiments, growth mask 1170 may be a different mask than the regrowth mask applied at step 1030. As shown, the cleaning process used in images 1100A and 1100B may result in mostly smooth vertical sidewalls of each mesa 1110. In some cases, the wet etching process may result in some undercut 1175 under the hard mask 1170, e.g., $SiO_2$ or $Si_3N_4$.

Figure 12:
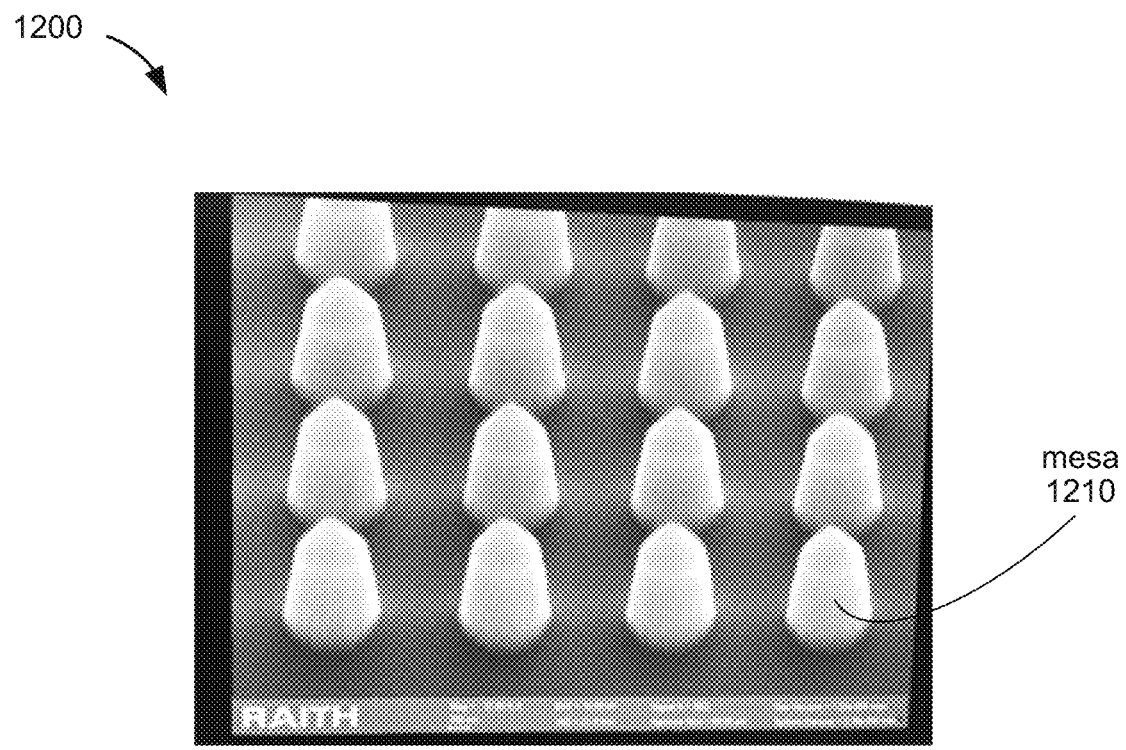
FIG. 12 provides an image depicting an array of mesas having undergone an annealing process.

In some embodiments, the one or more treatments at step 1040 may also include an annealing process. FIG. 12 provides image 1200 depicting an array of mesas 1210 having undergone an annealing process. The annealing process may be performed before growth of the regrowth layers on the epitaxial structures. The mesas 1210 depicted in image 1200 have undergone an insitu recrystallization process in a MOVPE reactor. This was performed at high temperatures, such as for example between 300° C. and 600° C. This process causes the mesa surfaces to recrystallize and reduce surface traps before application of the II-VI or III-V regrowth layers or other layers like SiN, $SiO_2$, HfO, AN, $Al_2O_3$, $TiO_2$ by PECVD, ICPECVD, ALD, or sputtering.

Figure 13A:
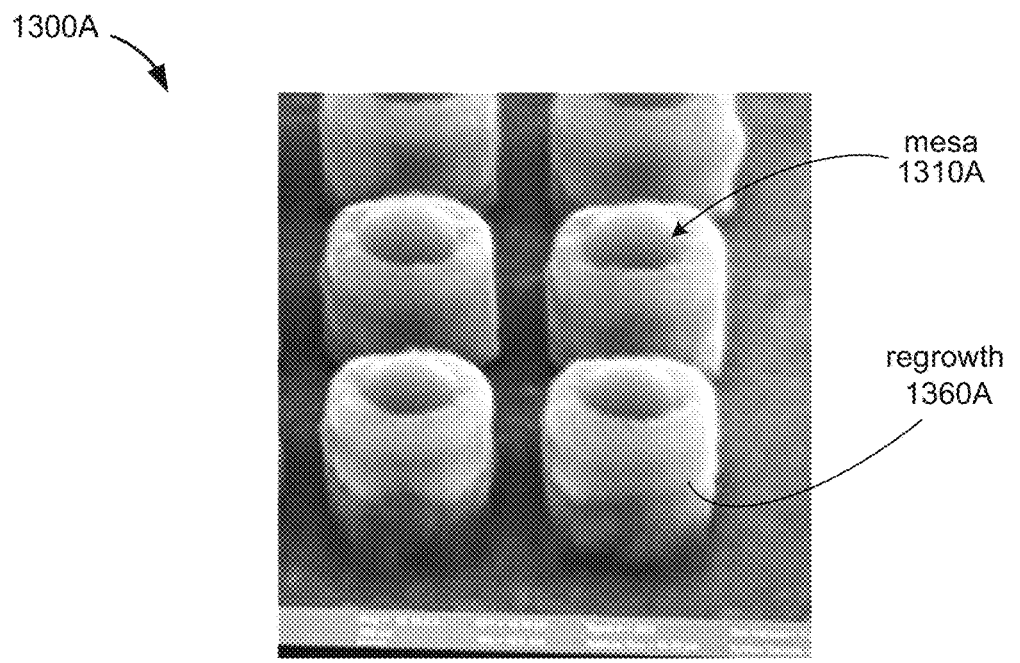
FIGS. 13A and 13B depict arrays of mesas having regrowth layers epitaxially grown on the mesa facets.
Figure 13B:
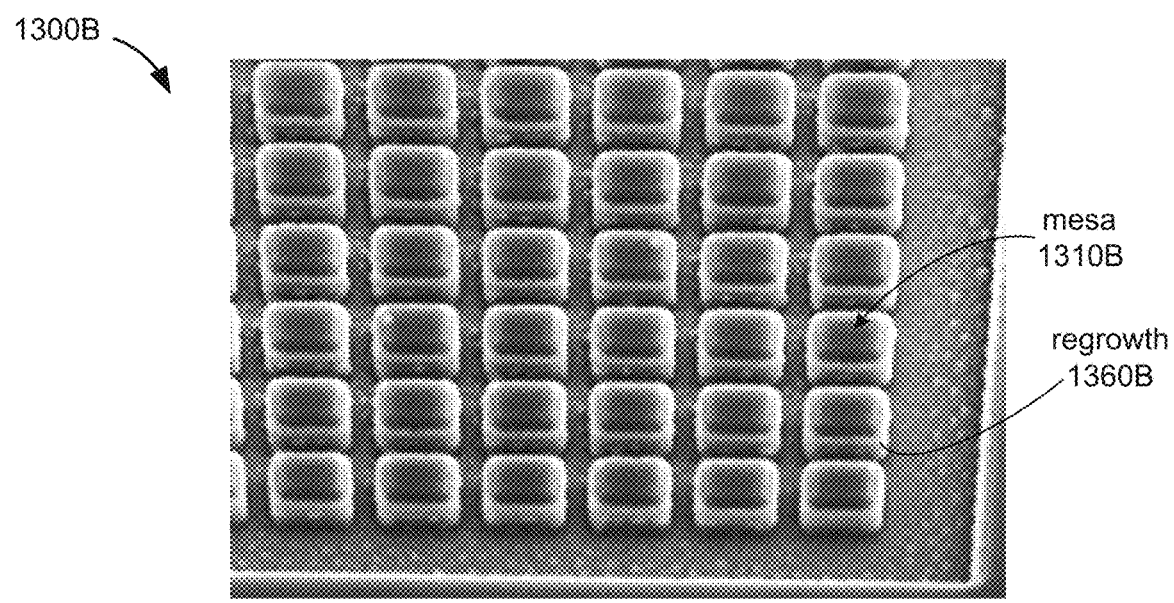
Figure 14A:
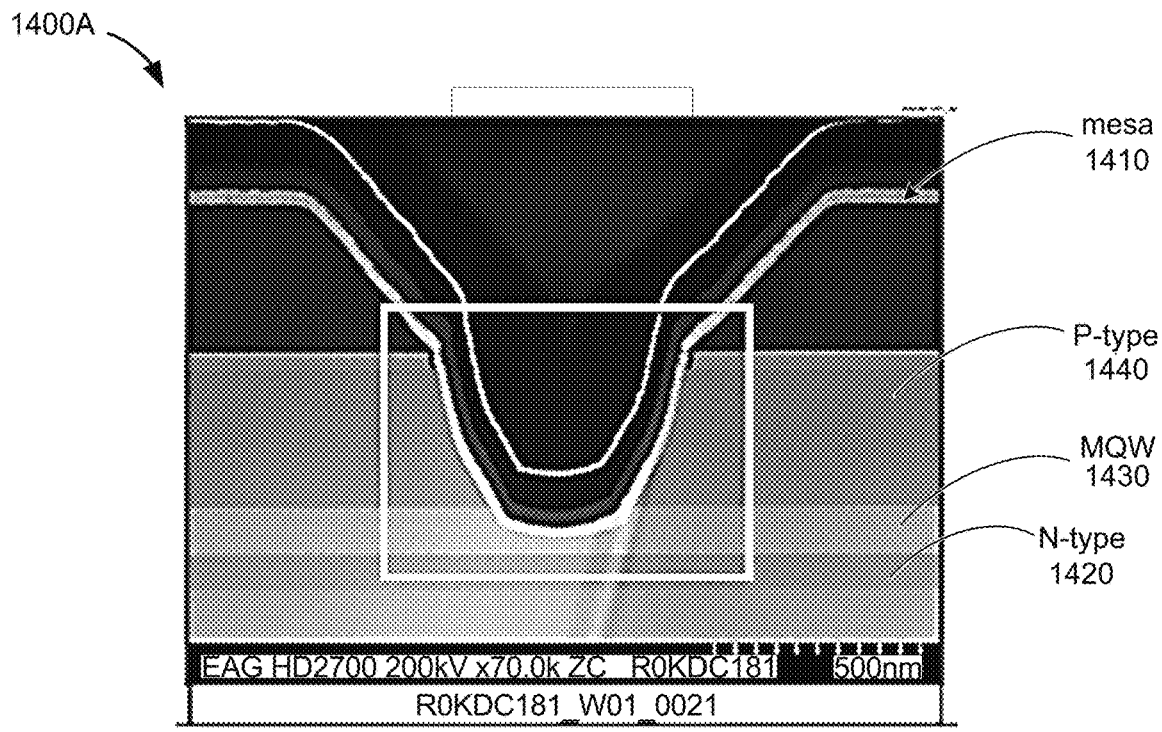
FIGS. 14A and 14B depict mesa structures having not undergone a BOE cleaning process prior to growth of a regrowth layer onto the epitaxial structure.
Figure 14B:
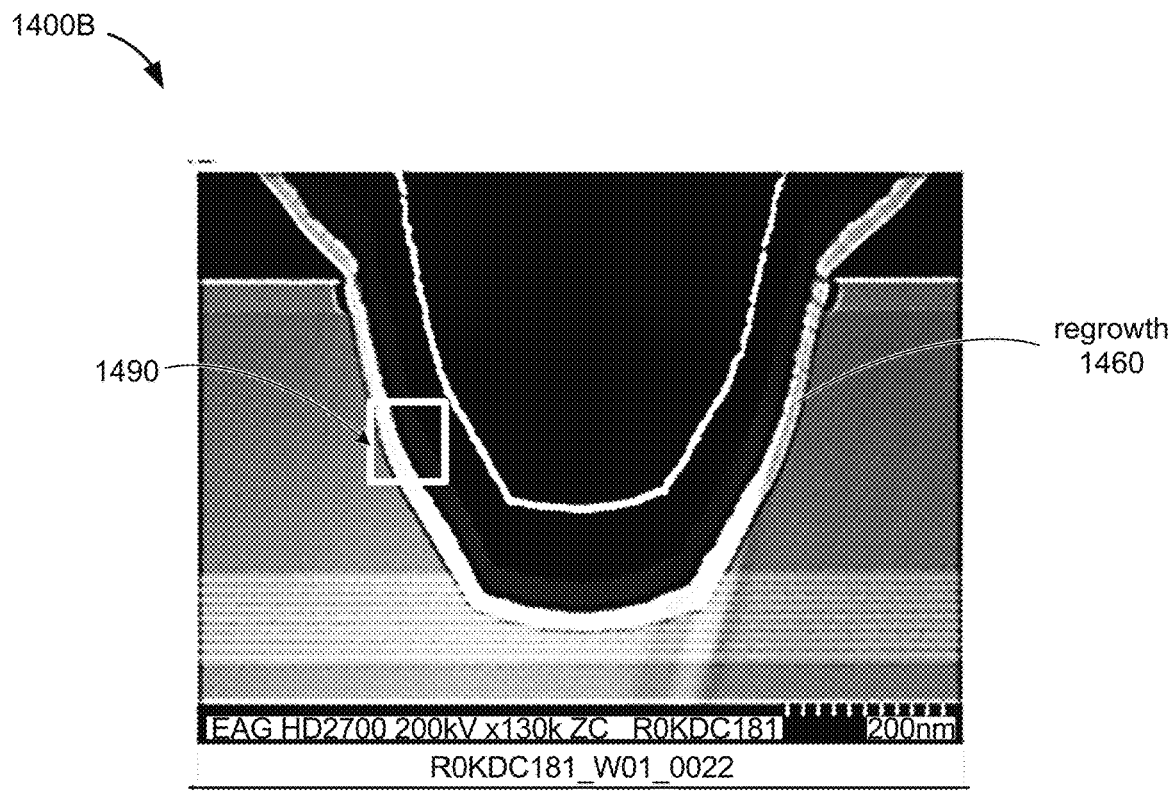

Next, method 1000 may include step 1050. At step 1050, one or more regrowth semiconductor layers, such as regrowth layers 360, 560, 660, 665, 960, or 965, may be epitaxially grown on the mesa facets. FIGS. 13A and 13B provide arrays of mesas having regrowth layers epitaxially grown on the mesa facets. FIG. 13A provides image 1300A depicting cylindrical mesas 1310A having a regrowth layer 1360A grown around the surface of the mesa structure. Similarly, FIG. 13B provides image 1300B depicting rectangular mesas 1310B having a regrowth layer 1360B grown around the surfaces of the mesa structure. Regrowth layers 1360A and 1360B include AlInP and were formed by MOVPE.

After the one or more regrowth semiconductor layers are grown on the mesa structure, method 1000 may include step 1060. At step 1060, the regrowth masks may be removed.

FIGS. 14A-19 provide an exemplary comparison of a mesa structure having undergone a BOE cleaning process versus a mesa structure having not undergone a BOE cleaning process prior to growth of a regrowth layer onto the epitaxial structure. Starting with FIGS. 14A and 14B, images 1400A and 1400B depict a mesa structure 1410. As shown by image 1400A, mesa structure 1410 includes an epitaxial structure. The epitaxial structure includes a N-type doped semiconductor layer 1420, a MQW layer 1430, and a P-type doped semiconductor layer 1440. The N-type doped semiconductor layer 1420 and the P-type doped semiconductor layer 1440 may be or include Al-rich cladding layers, for example AlInP, AlGaInP, or AlGaAs with an aluminum content greater than or equal to 40%. Image 1400B provides a close up view of the sidewall of mesa structure 1410. As shown by image 1400B, a regrowth layer 1460 has been grown on the sidewall of mesa structure 1410. The regrowth layer 1460 may include ZnSe. Mesa structure 1410 was subjected to a UHV H-clean prior to growth of the regrowth layer 1460. Mesa structure 1410, however, was not cleaned using a BOE cleaning process, as described above.

Figure 15A:
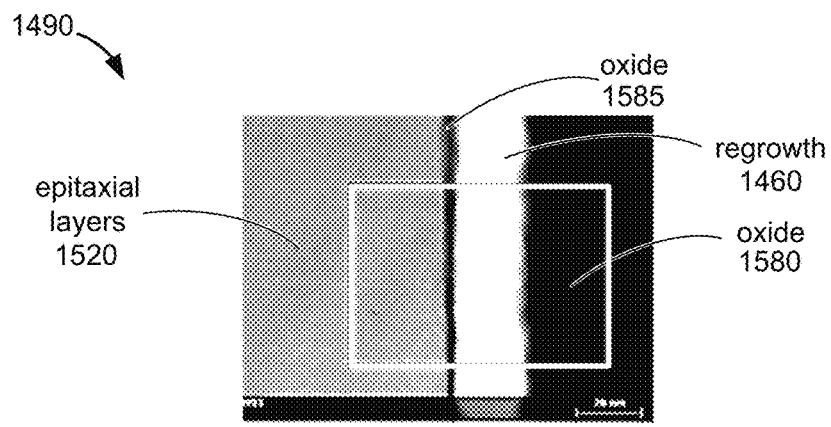
FIG. 15A provides a close up view of an interface between the regrowth layer and the epitaxial layers of the mesa sidewall.
Figure 15B:
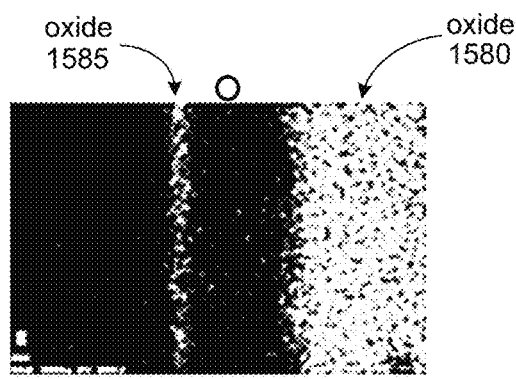
FIGS. 15B-15D provide images of elemental mapping of an interface between the regrowth layer and the epitaxial layers of the mesa sidewall.

FIGS. 15A and 15B illustrate the impact of not adequately removing subsurface damage and cleaning the mesa surface before growth of the regrowth layers. FIG. 15A provides a close up view of the interface 1490 from FIG. 14B between the regrowth layer 1460 and the epitaxial layers 1520 of the mesa sidewalls. The epitaxial layers 1520 may include the N-type doped semiconductor layer 1420, the MQW layer 1430, and the P-type doped semiconductor layer 1440. As shown by interface 1490, a thin oxide layer 1585 may be present between the epitaxial layers 1520 and the regrowth layer 1460. The thin oxide layer 1585 may be left over, for example, after mesa etching and wafer handling in air for example. The different vertically stacked epitaxial layers 1520 may have different material composition at mesa facet resulting in different oxides. For example, for a mesa structure including AlGaAs, AlGaInP, GaInP, GaAs-layers, GaO and InO may form at mesa surfaces with less bonding energy than AlO at the surface. GaO and InO may be easier to attack and remove by, for example, a wet etch process, a UHV-vacuum clean with $H_2$ in a MBE-chamber, a soft back sputter process, and the like. A main problem may be the removal of AlO-based compounds for Al-rich epitaxial layers without damage to the mesa facet.

The thin oxide layer 1585 may be left over from preceding process steps after a mesa etch process. If the epitaxial layers 1520 include higher concentrations of aluminum, as they do here, then the thin oxide layer 1585 may form on the epitaxial layers 1520. Due to compositional differences between different material layers in the epitaxial layers 1520, different types of oxides may form at the sidewalls. Therefore, in some embodiments, different cleaning process may completely remove oxides (e.g., GaO or InO), such as thin oxide layer 1585, at certain layers (e.g., Ga-rich layer like a MQW layer) but not remove other oxides (e.g., AlO) at other layers, such as for example, a Al-rich P-type or N-type cladding layer. The larger oxide layer 1580 is also present. The oxide layer 1580 may be an additional dielectric layer deposition of $Al_2O_3$ after the regrowth layer 1460 is formed. The oxide layer 1580 is in contact with the regrowth layer 1460.

Figure 15C:
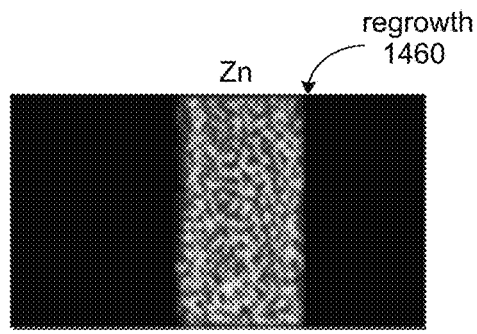
Figure 15D:
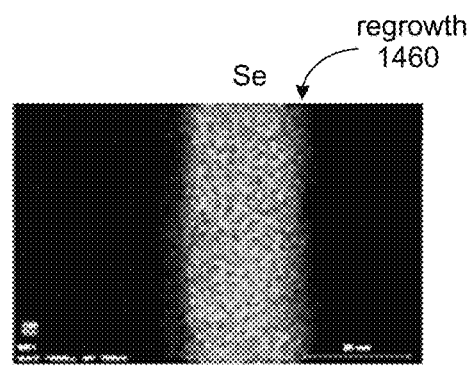

FIGS. 15B, 15C, and 15D provide images of elemental mapping of the interface 1490 between the regrowth layer 1460 and the epitaxial layers 1520. Elemental mapping shows the presence of an element across a depth of a material. Here, the images of FIGS. 15B, 15C, and 15D show the elemental distribution of oxygen, zinc, and selenium across the depth of the interface 1490. The regrowth layer 1460 includes ZnSe, thus the presence of zinc and selenium, shown in FIGS. 15C and 15D, indicates the presence of the regrowth layer 1460. The elemental distribution provided in FIG. 15B indicates the presence of the thin oxide layer 1858 and oxide layer 1580 at the interface 1490 depicted in image 1500B. By aligning FIGS. 15B, 15C, and 15D, the presence of the thin oxide layer 1585 between the epitaxial layers 1520 and the regrowth layer 1460 is evident.

Figure 16:
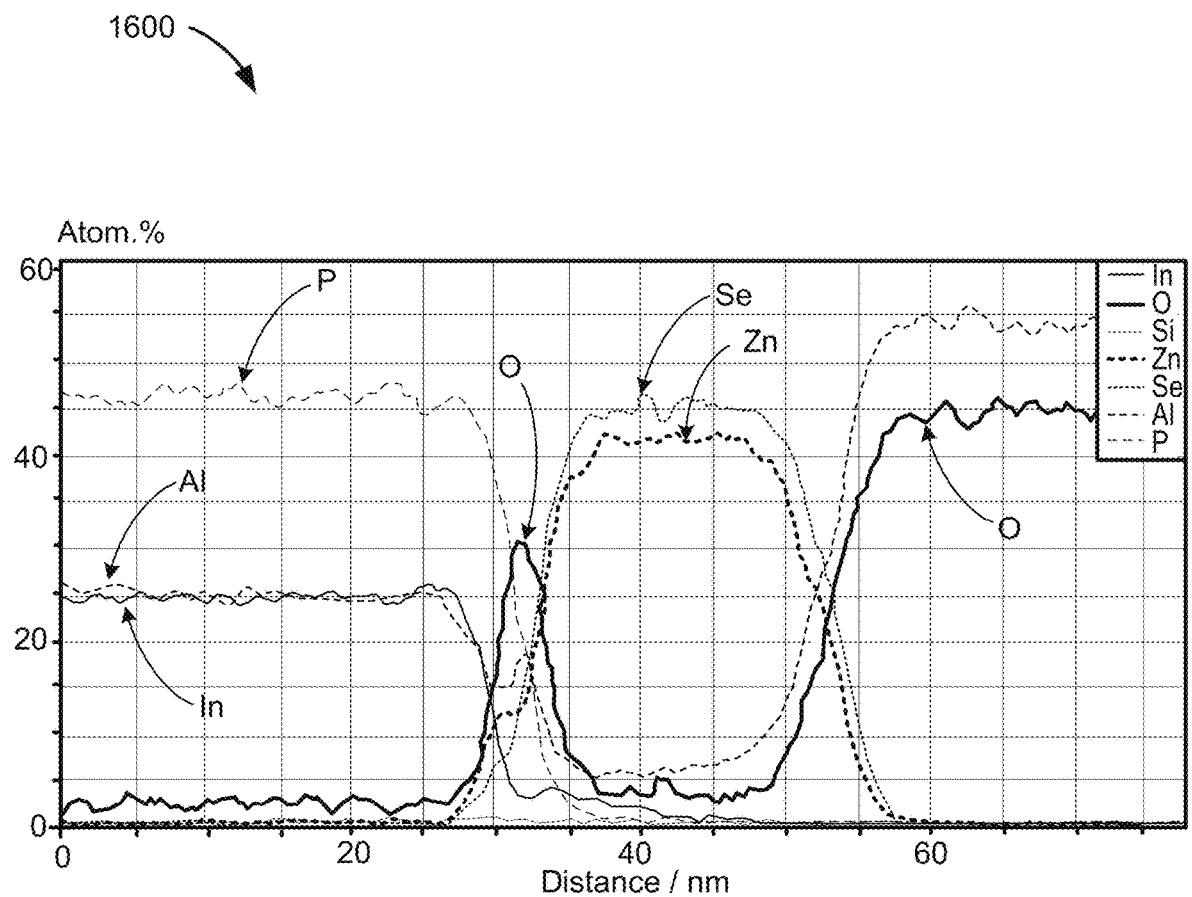
FIG. 16 provides a graph showing elemental distribution through a depth of an interface. between the regrowth layer and the epitaxial layers of the mesa sidewall.

FIG. 16 provides graph 1600 of elemental distribution through a depth of the interface 1490 depicted in image 1500. The x-axis of graph 1600 is a distance extending from the epitaxial layers 1520 to the regrowth layer 1460. The y-axis provides an atomic percentage of each element through the depth. As shown by graph 1600, the epitaxial layers 1520 extend between approximately 0 and 30 nm into the interface 1490. This is indicated by the presence of aluminum, indium, and phosphate at these depths which corresponds to an AlInP cladding layer that is part of the epitaxial layers 1520. The regrowth layer 1460 extends between approximately 35 nm and 55 nm in the interface 1490. This is indicated by the presence of zinc and selenium at these depths which correspond to the ZnSe regrowth layer 1460. As indicated by an increase of oxygen between 27 nm and 30 nm, the thin oxide layer 1585 is present between the epitaxial layers 1520 and the regrowth layer 1460. The presence of the oxide layer 1580 is indicated by the increase of oxygen starting at 50 nm. The presence of the thin oxide layer 1585 may be undesirable because it may lead to amorphous or polycrystalline overgrowths with more traps of a carrier than good crystalline material quality of the regrowth layer 1460.

Figure 17:
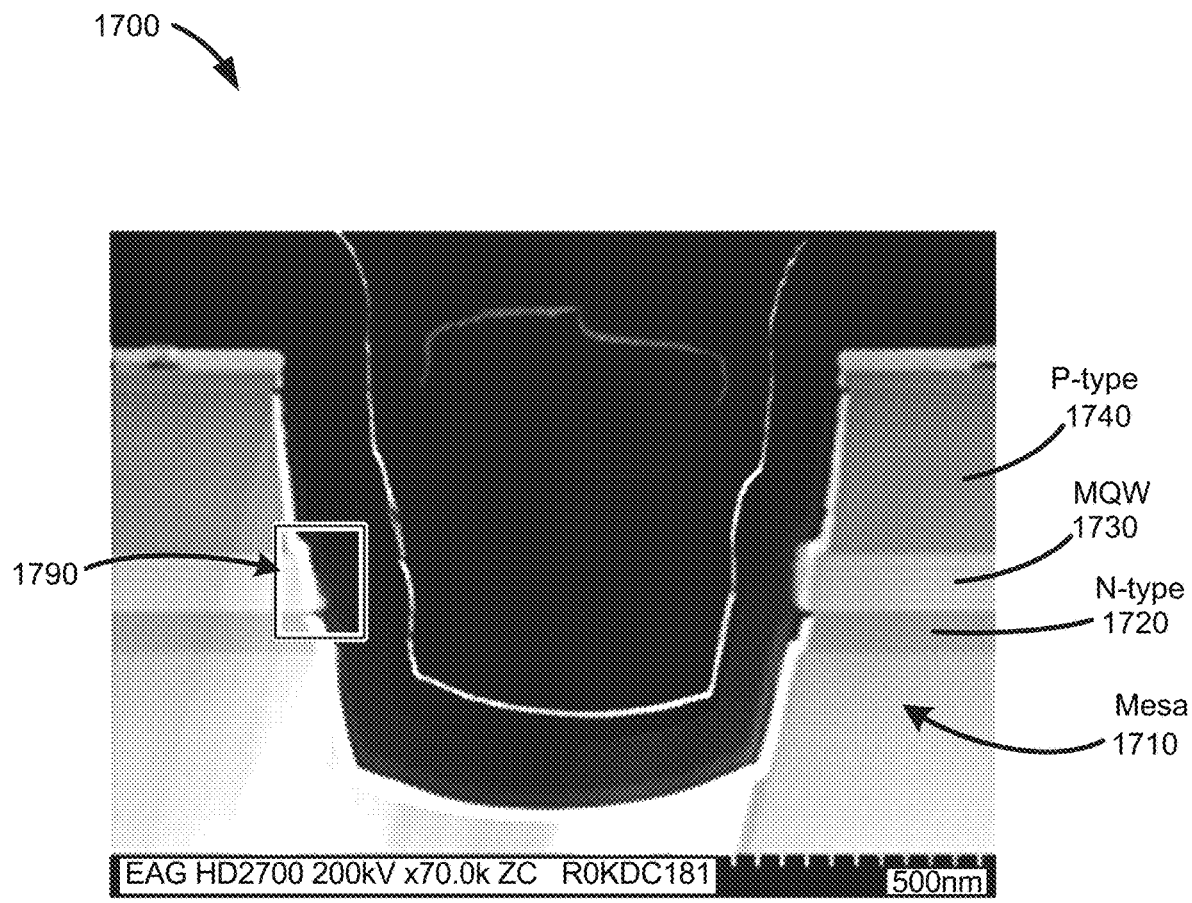
FIG. 17 provides an image of a mesa structure having undergone a BOE cleaning process before application of the regrowth layer.
Figure 18A:
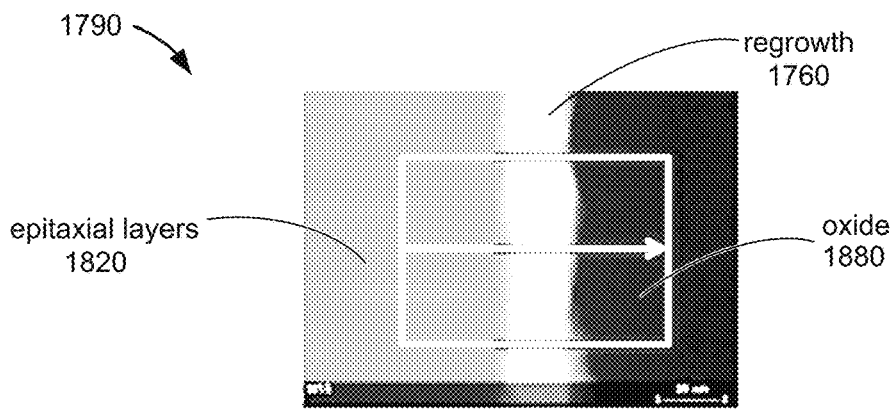
FIG. 18A provides a close up view of an interface between the regrowth layer and the epitaxial layers of the mesa sidewall.

FIG. 17 provides image 1700 of a mesa structure 1710 having undergone a BOE cleaning process before application of the regrowth layer. Mesa structure 1710 was also subjected to a UHV H-clean prior to growth of the regrowth layer 1760. As shown, mesa structure 1710 includes an epitaxial structure. The epitaxial structure includes a N-type doped semiconductor layer 1720, a MQW layer 1730, and a P-type doped semiconductor layer 1740. FIG. 18A provides a close up view of interface 1790. Interface 1790 shows the interface between epitaxial layers 1820 and regrowth layer 1760. The regrowth layer 1760 includes ZnSe. As shown by interface 1790, there is no thin oxide layer between the epitaxial layers 1820 and the regrowth layer 1760. Only an oxide layer 1880 is in contact with regrowth layer 1760 at the interface 1790.

Figure 18B:
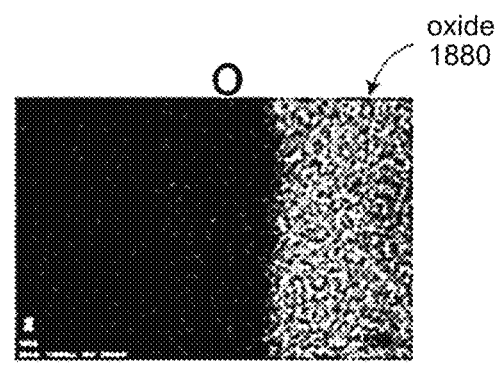
FIGS. 18B-18D provide images of elemental mapping of an interface between the regrowth layer and the epitaxial layers of the mesa sidewall.
Figure 18C:
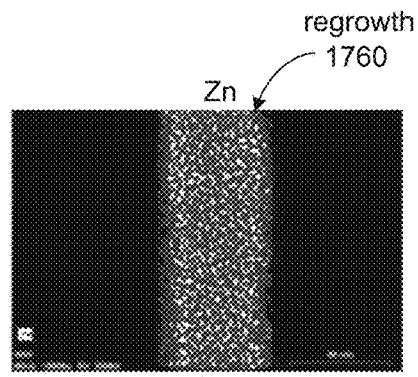
Figure 18D:
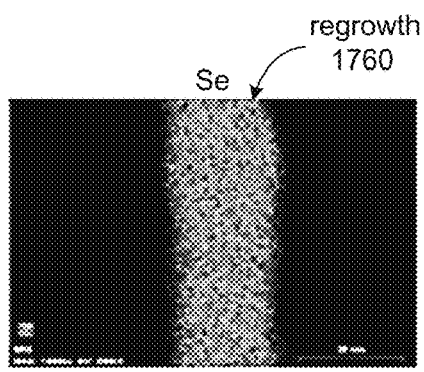

FIGS. 18B, 18C, and 18D provide elemental distributions of oxygen, zinc, and selenium at interface 1790. FIG. 18B depicts the presence of oxygen, thereby indicating the presence of oxide layer 1880 at the interface 1790. FIGS. 18C and 18D depict the presence of zinc and selenium, respectively, thereby indicating the presence of the regrowth layer 1760 at the interface 1790. Unlike FIG. 15B, there is no thin oxide layer between the epitaxial layers 1820 and the regrowth layer 1760.

Figure 19:
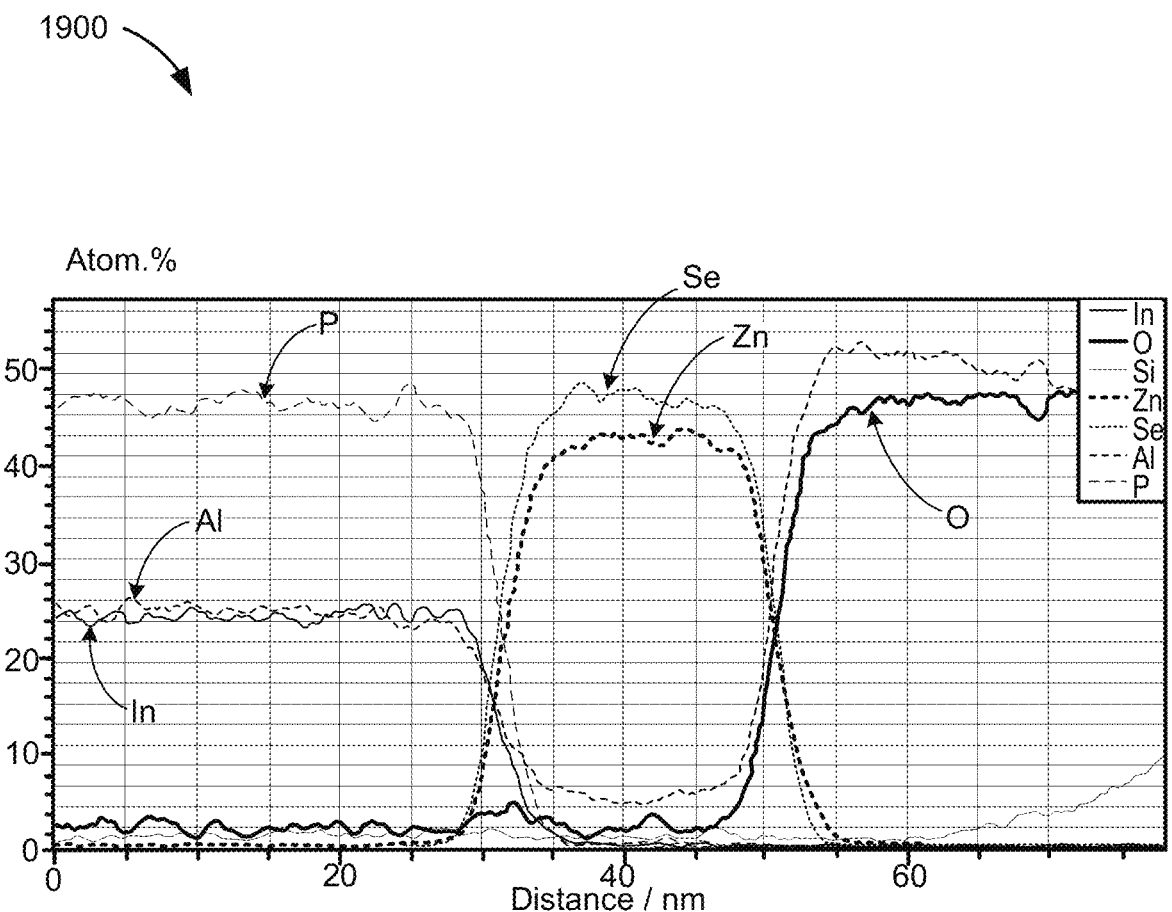
FIG. 19 provides a graph showing elemental distribution through a depth of an interface. between the regrowth layer and the epitaxial layers of the mesa sidewall.

Graph 1900 provided in FIG. 19 also illustrates the lack of a thin oxide layer between the epitaxial layers 1820 and the regrowth layer 1760. Graph 1900 is similar to graph 1600 in that it shows elemental distribution across a depth of interface 1790. Similar to graph 1600, epitaxial layers 1820 are indicated between approximately 0 nm and 30 nm by the presence of aluminum, indium, and phosphate. Next, regrowth layer 1760 is indicated between 30 nm and 50 nm by the presence of zinc and selenium. As shown by graph 1900, there is no increase of oxygen between 30 nm and 35 nm, indicating a lack of thin oxide layer between the epitaxial layers 1820 and the regrowth layer 1760. The presence of the oxide layer 1880 is indicated starting at 55 nm by the increase of oxygen.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A light emitting diode (LED) array apparatus comprising:
    a plurality of mesas etched from a layered epitaxial structure, wherein the layered epitaxial structure comprises a P-type doped semiconductor layer, an active layer, and an N-type doped semiconductor layer; and
    one or more regrowth semiconductor layers, including a first regrowth semiconductor layer, grown epitaxially over etched facets of the plurality of mesas,
    wherein for each mesa, the first regrowth semiconductor layer overlays etched facets of the P-type doped semiconductor layer, the active layer, and the N-type doped semiconductor layer, around an entire perimeter of the mesa, but with the first regrowth semiconductor layer being absent from a top surface of the mesa.

2. The apparatus of claim 1, wherein the one or more regrowth semiconductor layers at least partially fill voids between adjacent mesas of the plurality of mesas.

3. The apparatus of claim 1, wherein the first regrowth semiconductor layer:
   comprises a wide-bandgap (WBG) semiconductor material; and
   is doped to attain a Fermi level sufficient for the first regrowth semiconductor layer to act as an insulator that prevents charge flow between the P-type doped semiconductor layer and the N-type doped semiconductor layer and through the first regrowth semiconductor layer.

4. The apparatus of claim 1, wherein the first regrowth semiconductor layer comprises a material selected from: aluminum nitride (AlN), aluminum gallium nitride (AlGaN), aluminum gallium arsenide (AlGaAs), aluminum indium phosphide (AlInP), aluminum gallium indium phosphide (AlGaInP) with a higher aluminum content than the active layer, or zinc oxide (ZnO).

5. The apparatus of claim 1, wherein the one or more regrowth semiconductor layers include a second regrowth semiconductor layer grown as a further epitaxial layer over the first regrowth semiconductor layer.

6. The apparatus of claim 5, wherein:
   the first regrowth semiconductor layer comprises a wide-bandgap (WBG) semiconductor material; and
   the second regrowth semiconductor layer comprises a narrow-bandgap (NBG) semiconductor material.

7. The apparatus of claim 6, wherein:
   the wide-bandgap semiconductor material is undoped; and
   the narrow-bandgap semiconductor material is doped.

8. The apparatus of claim 6, wherein the one or more regrowth semiconductor layers further include a transition layer between the first regrowth semiconductor layer and the etched facets of the P-type doped semiconductor layer, the active layer, and the N-type doped semiconductor layer.

9. The apparatus of claim 8, wherein the transition layer comprises a material having a bandgap narrower than the bandgap of the WBG semiconductor material but wider than the bandgap of the NBG semiconductor material.

\* \* \* \* \*